US012686411B2

(12) United States Patent \
Zhang et al.

(10) Patent No.: US 12,686,411 B2 \
(45) Date of Patent: Jul. 21, 2026

(54) METHOD FOR TESTING AUTONOMOUS-DRIVING ALGORITHM, AND RELATED DEVICE

(71) Applicant: HUAWEI TECHNOLOGIES CO., LTD., Shenzhen (CN)

(72) Inventors: Baokuan Zhang, Shenzhen (CN); Lei Zhang, Shenzhen (CN); Chao Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 254 days.

(21) Appl. No.: 18/215,581

(22) Filed: Jun. 28, 2023

(65) Prior Publication Data

US 2023/0339513 A1 Oct. 26, 2023

Related U.S. Application Data

(63) Continuation of application No. PCT/CN2021/136414, filed on Dec. 8, 2021.

(30) Foreign Application Priority Data

Dec. 31, 2020 (CN) .......................... 202011645222.0

(51) Int. Cl. \
*B60W 60/00* (2020.01) \
*G06F 30/20* (2020.01)

(52) U.S. Cl. \
CPC ......... *B60W 60/0027* (2020.02); *G06F 30/20* (2020.01); *B60W 2554/40* (2020.02)

(58) Field of Classification Search \
None \
See application file for complete search history.

(56) References Cited

U.S. PATENT DOCUMENTS

2018/0349547 A1* 12/2018 Sun ............................ G06F 9/46 \
2019/0004516 A1* 1/2019 Liu ...................... G05D 1/0088 \
(Continued)

FOREIGN PATENT DOCUMENTS

CN 108803607 A 11/2018 \
CN 109927719 A 6/2019 \
(Continued)

OTHER PUBLICATIONS

Qianwen Chao et al:"A Survey on Visual Traffic Simulation: Models, Evaluations, and Applications in Autonomous Driving", Computer Graphics Forum:Journal of the European Association for Computer Graphics,Wiley-Blackwell,Oxford,vol. 39, No. 1,XP071489753,Jul. 15, 2019,total 22 pages.

*Primary Examiner* — James J Lee \
*Assistant Examiner* — Melanie G Huber \
(74) *Attorney, Agent, or Firm* — WOMBLE BOND DICKINSON (US) LLP

(57) ABSTRACT

The method includes: obtaining N obstacles from an obstacle set based on a test function of the autonomous-driving algorithm, and storing an ID and initial motion information of each of the N obstacles to an obstacle resource pool; obtaining motion information of a surrounding obstacle of a first obstacle from the obstacle resource pool based on an ID of the first obstacle, and controlling moving of the first obstacle based on the motion information of the surrounding obstacle of the first obstacle, to obtain motion information of the first obstacle; storing the motion information to the obstacle resource pool; obtaining a result of interaction between an ego vehicle and n obstacles from the obstacle resource pool based on location information of the ego vehicle; and determining a test result of the autonomous-driving algorithm based on the interaction result.

18 Claims, 11 Drawing Sheets

(56) References Cited

U.S. PATENT DOCUMENTS

| | | | |
|---|---|---|---|
| 2019/0107839 A1* | 4/2019 | Parashar | G05D 1/0223 |
| 2020/0074266 A1* | 3/2020 | Peake | G06V 10/764 |
| 2020/0276708 A1* | 9/2020 | Shah | B25J 19/04 |
| 2020/0393567 A1* | 12/2020 | Schroeter | G01S 19/01 |
| 2020/0410062 A1* | 12/2020 | O'Malley | B60W 60/001 |
| 2021/0157882 A1* | 5/2021 | Liu | G06F 11/3698 |
| 2022/0108049 A1* | 4/2022 | Letwin | G08G 9/00 |

FOREIGN PATENT DOCUMENTS

| | | |
|---|---|---|
| CN | 109993849 A | 7/2019 |
| CN | 110414098 A | 11/2019 |
| CN | 111338232 A | 6/2020 |
| CN | 111625950 A | 9/2020 |

* cited by examiner

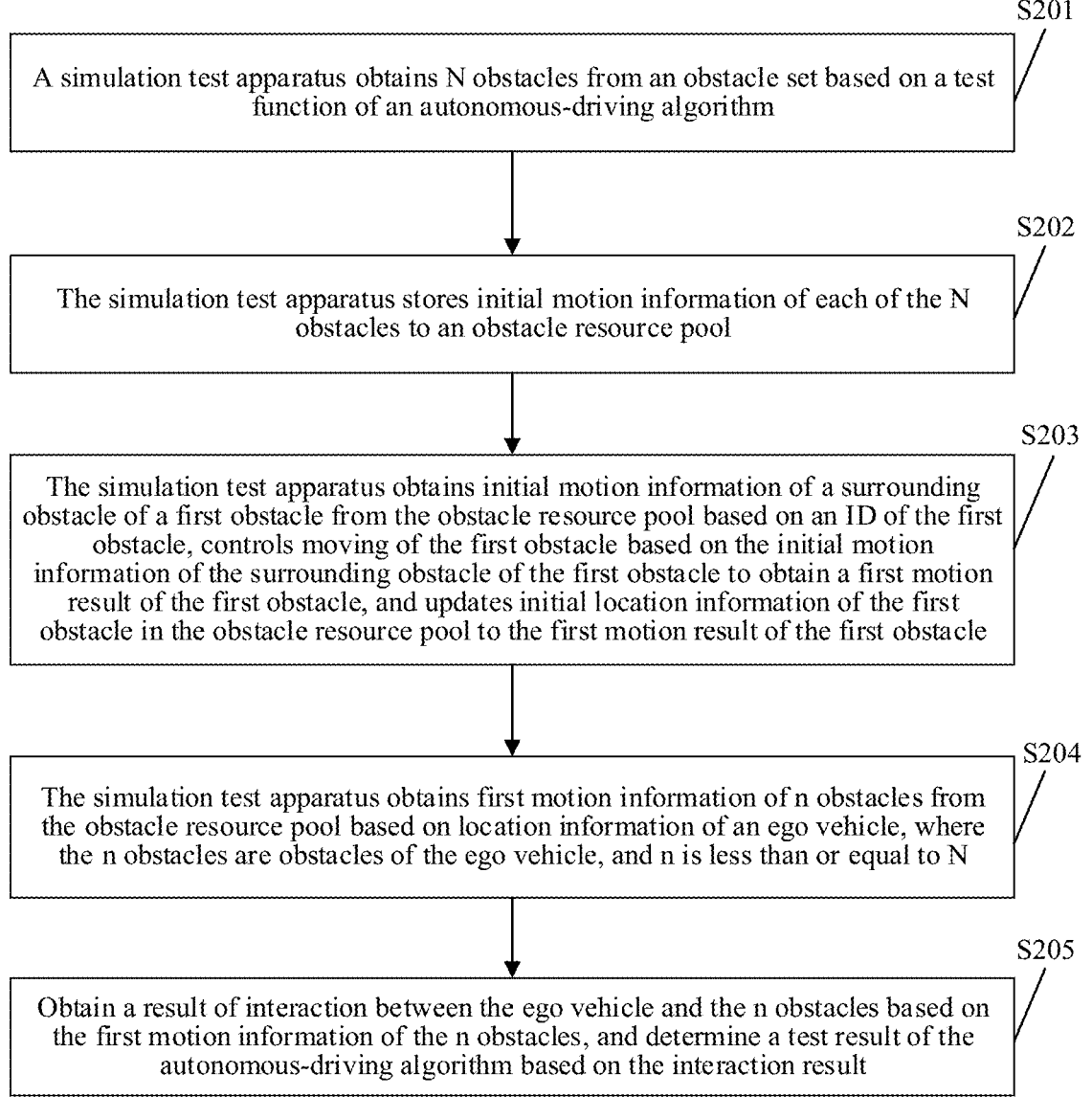

S201

A simulation test apparatus obtains N obstacles from an obstacle set based on a test function of an autonomous-driving algorithm

S202

The simulation test apparatus stores initial motion information of each of the N obstacles to an obstacle resource pool

S203

The simulation test apparatus obtains initial motion information of a surrounding obstacle of a first obstacle from the obstacle resource pool based on an ID of the first obstacle, controls moving of the first obstacle based on the initial motion information of the surrounding obstacle of the first obstacle to obtain a first motion result of the first obstacle, and updates initial location information of the first obstacle in the obstacle resource pool to the first motion result of the first obstacle

S204

The simulation test apparatus obtains first motion information of n obstacles from the obstacle resource pool based on location information of an ego vehicle, where the n obstacles are obstacles of the ego vehicle, and n is less than or equal to N

S205

Obtain a result of interaction between the ego vehicle and the n obstacles based on the first motion information of the n obstacles, and determine a test result of the autonomous-driving algorithm based on the interaction result

FIG. 2

Yellow lines    Track    Navigation-type
obstacle

Navigation-type
obstacle    Field of view of
the navigation-
type obstacle

1200

1300

METHOD FOR TESTING AUTONOMOUS-DRIVING ALGORITHM, AND RELATED DEVICE

CROSS-REFERENCE TO RELATED APPLICATIONS

This application is a continuation of International Application No. PCT/CN2021/136414, filed on Dec. 8, 2021, which claims priority to Chinese Patent Application No. 202011645222.0, filed on Dec. 31, 2020. The disclosures of the aforementioned applications are hereby incorporated by reference in their entireties.

TECHNICAL FIELD

This application relates to the field of autonomous driving, and in particular, to a method for testing an autonomous-driving algorithm, and a related device.

BACKGROUND

Road tests are the core of implementations of autonomous driving. Researches show that, for autonomous driving, millions of kilometers of road tests need to be accumulated to ensure the safety and reliability of the entire autonomous-driving link: perception, decision-making, and control. There are problems such as high research and development costs, high potential safety risks, and low algorithm development efficiency in algorithm verification performed through real-vehicle road tests. Therefore, simulation software is usually used in the industry to construct virtual scenarios for algorithm testing and verification.

However, most autonomous-driving simulation software builds a single simulation scenario and faces a key problem of low verification efficiency of complex scenarios: It is difficult to build the complex scenarios, and the uncertainty of real road conditions cannot be restored. The autonomous driving system cannot accurately respond to real road emergencies. It is difficult for autonomous driving to make further breakthroughs.

There are many difficulties in building complex scenarios using autonomous-driving simulation software, such as: (1) How to build a typical micro-simulation scenario, and provide micro-behaviors of different types of obstacles, for example, the scenario such as vehicle avoidance, lane changing, vehicle following, overtaking, sudden acceleration, and braking, the micro-behaviors such as road crossing and red light running of pedestrians, and static obstacles; (2) How to build a macro traffic flow simulation scenario to simulate random traffic flow and traffic congestion scenarios; (3) How to effectively use the data collected by the road test to make the obstacles in the real scenario collected by the road test have dynamic interaction and increase the complexity of the scenario is also an urgent problem to be resolved; and (4) How to efficiently and centrally manage obstacles from different sources to implement interaction between all obstacles in a simulation platform and increase simulation authenticity is a difficult problem to be resolved in the industry.

FIG. 1 shows a typical traffic scenario in which vehicles, non-motorized vehicles, pedestrians, and fences constitute a complex scenario involving macro random traffic flows and micro scenarios (such as lane changing and braking of vehicles, road crossing, and other behaviors of pedestrians). If similar complex and extreme scenarios can be built in the autonomous-driving simulation software to verify an autonomous-driving algorithm, it is extremely helpful for the autonomous driving system to make a rapid breakthrough.

SUMMARY

Embodiments of this application provide a method for testing an autonomous-driving algorithm, and a related device. An obstacle resource pool is introduced, so that obstacles are efficiently and centrally managed, providing convenience for building complex test scenarios.

According to a first aspect, this application provides a method for testing an autonomous-driving algorithm. The test method includes:

N obstacles from an obstacle set are obtained based on a test function of the autonomous-driving algorithm, where the N obstacles include an obstacle of an ego vehicle and a surrounding obstacle of the obstacle of the ego vehicle, and N is an integer greater than 0. An ID and initial motion information of each of the N obstacles are stored to an obstacle resource pool. Motion information of a surrounding obstacle of a first obstacle from the obstacle resource pool is obtained based on an ID of the first obstacle, and moving of the first obstacle is controlled based on the motion information of the surrounding obstacle of the first obstacle, to obtain motion information of the first obstacle. Motion information of each obstacle is stored to the obstacle resource pool. First motion information of n obstacles is obtained from the obstacle resource pool based on location information of the ego vehicle, where the n obstacles are obstacles of the ego vehicle, and n is less than or equal to N. A result of interaction between the ego vehicle and the n obstacles is obtained based on the first motion information of the n obstacles. A test result of the autonomous-driving algorithm is determined based on the interaction result.

There are a part or all of the following types of obstacles in the N obstacles: a refined track obstacle, a navigation-type obstacle, a macro traffic flow, and/or a real road test obstacle. The road test obstacles are obstacles collected by vehicles during driving in real environments.

In an embodiment, after the N obstacles are obtained from the obstacle set, an ID is allocated to each of the N obstacles, and each obstacle is configured, to obtain an ID and configuration information of each obstacle, and to obtain an ID and configuration information of each of the N obstacles. Alternatively, the obstacle set includes IDs and configuration information of various types of obstacles. Therefore, when the N obstacles are obtained from the obstacle set, this implies obtaining the IDs and configuration information of the N obstacles from the obstacle set, and no additional configuration needs to be performed on the obstacles. The configuration information of the obstacle includes initial motion information.

By introducing the obstacle resource pool, different types of obstacles in the test scenario are centrally managed, which provides convenience for building complex test scenarios. The macro traffic flow and the road test obstacle are introduced to further provide convenience for building complex test scenarios.

In an embodiment, the obstacle resource pool includes a first cache and a second cache, the initial motion information includes initial location information, and the method in this application further includes:

Hash processing is performed on the ID of each of the N obstacles, to obtain an ID hash value of each obstacle. The ID hash value of each obstacle indicates a storage space of motion information of the obstacle in the first cache.

The storing an ID and initial motion information of each of the N obstacles to an obstacle resource pool includes:

The initial motion information of each of the N obstacles is stored to the storage space indicated by the ID hash value of the obstacle in the first cache. By using initial location information of each of the N obstacles as an index, the ID and the initial location information of the obstacle are stored to the second cache.

The ID of the obstacle is stored in the obstacle resource pool by using the location information as an index, so that when an obstacle in a field of view of the obstacle is subsequently searched for. An ID of the obstacle in the field of view of the obstacle may be quickly searched based on the location information, thereby improving search efficiency.

In an embodiment, the obstacle resource pool includes the first cache and the second cache, and the obtaining motion information of a surrounding obstacle of a first obstacle from the obstacle resource pool based on an ID of the first obstacle includes:

The initial motion information of the first obstacle is obtained from the first cache based on an ID hash value of the first obstacle, where the initial motion information includes initial location information, and the ID hash value of the first obstacle is obtained by performing hash processing on the ID of the first obstacle. IDs of S obstacles are obtained from the second cache based on the initial location information of the first obstacle, where the S obstacles are obstacles located in a preset area of the first obstacle, and the preset area of the first obstacle is determined based on the initial location information of the first obstacle. The surrounding obstacle of the first obstacle is determined from the S obstacles based on a motion mode of the first obstacle. The surrounding obstacle of the first obstacle is an obstacle that is among the S obstacles and that potentially interacts with the first obstacle when the first obstacle moves in the motion mode. The initial motion information of the surrounding obstacle is obtained from the first cache based on an ID hash value of the surrounding obstacle of the first obstacle, where the ID hash value of the surrounding obstacle of the first obstacle is obtained by performing hash processing on the ID of the surrounding obstacle of the first obstacle.

During interaction between obstacles, a preset area of the obstacle (the area may be considered as a field of view of the obstacle) is introduced, to avoid searching for an obstacle that potentially interacts with the obstacle in a range of the obstacle resource pool, thereby efficiently implementing interaction between obstacles. In addition, interaction between a road test obstacle and another obstacle is implemented in this manner, so that the road test obstacle and another obstacle that interacts with the road test obstacle constitute a hardware in the loop (HIL) scenario, which provides convenience for building complex test scenarios while making effective use of road test obstacles.

In an embodiment, the first motion information includes first location information, and the updating initial motion information of the first obstacle in the obstacle resource pool to the first motion information includes:

An ID corresponding to the initial location information of the first obstacle from the second cache is determined based on the initial location information of the first obstacle. The initial location information of the first obstacle in the second cache is updated to the first location information of the first obstacle if the ID corresponding to the initial location information of the first obstacle is the ID of the first obstacle. The initial motion information of the first obstacle in the first cache is updated to the first motion information based on the ID hash value of the first obstacle.

The motion information of the obstacle is updated in real time, so that during subsequent interaction between the obstacles, the obstacle can obtain motion information of an obstacle that potentially interacts with the obstacle, so that interaction between the obstacles is more reasonable.

In an embodiment, the method in this application further includes:

An ID and configuration information of a newly added obstacle is obtained based on user instructions, and the configuration information of the newly added obstacle is parsed, to obtain initial motion information of the newly added obstacle. The initial motion information includes initial location information of the newly added obstacle. Hash processing is performed on the ID of the newly added obstacle, to obtain an ID hash value of the newly added obstacle. The initial motion information of the newly added obstacle is stored to a storage space indicated by the ID hash value of the newly added obstacle in the first cache. The ID and the initial motion information of the newly added obstacle are stored to the second cache of the obstacle resource pool by using the initial location information of the newly added obstacle as an index. In addition, in a subsequent process, related information of the newly added obstacle in the obstacle resource pool may be updated in the foregoing manner.

The newly added obstacle includes a part or all of a refined track obstacle, a navigation-type track obstacle, a macro traffic flow, and/or a road test obstacle.

By randomly inserting a plurality of types of obstacles such as the macro traffic flow, the navigation-type obstacle, and the refined track obstacle into the test scenario, detailed simulation of a specified scenario can be implemented, which greatly improves the flexibility and intelligence of the simulation scenario.

In an embodiment, the first motion information includes first location information, and the obtaining first motion information of n obstacles from the obstacle resource pool based on location information of the ego vehicle includes:

IDs and first location information of M obstacles are determined from the second cache based on the location information of the ego vehicle. The M obstacles are obstacles located within a preset range of the ego vehicle. The preset range of the ego vehicle is determined based on the location information of the ego vehicle, and M is a positive integer less than or equal to N. The n obstacles are determined from the M obstacles based on a preset interaction manner and the first location information of the M obstacles. The n obstacles are the obstacles that potentially interact with the ego vehicle. First motion information of each of the n obstacles is determined from the first cache based on an ID hash value of each of the n obstacles.

By introducing the preset range of the ego vehicle, an obstacle located within the preset range of the ego vehicle can be quickly determined from the second cache of the obstacle resource pool, thereby improving search efficiency.

According to a second aspect, an embodiment of the application further provides a simulation test apparatus, the simulation test apparatus includes:

an obtaining unit, configured to obtain N obstacles from an obstacle set based on a test function of an autonomous-driving algorithm, where the N obstacles include an obstacle of an ego vehicle and a surrounding obstacle of the obstacle of the ego vehicle, and there are a part or all of the following types of obstacles in the N obstacles: a refined track obstacle, a navigation-type obstacle, a macro traffic flow, and/or a road test obstacle; and N is an integer greater than 0;

a storage unit, configured to store an ID and initial motion information of each of the N obstacles to an obstacle resource pool; and a simulation test unit, configured to: obtain motion information of a surrounding obstacle of a first obstacle from the obstacle resource pool based on an ID of the first obstacle, and control moving of the first obstacle based on the motion information of the surrounding obstacle of the first obstacle, to obtain first motion information of each obstacle; update initial motion information of the first obstacle in the obstacle resource pool to the first motion information of the first obstacle; obtain first motion information of n obstacles from the obstacle resource pool based on location information of the ego vehicle, where the n obstacles are obstacles of the ego vehicle, and n is less than or equal to N; obtain a result of interaction between the ego vehicle and the n obstacles based on the first motion information of the n obstacles; and determine a test result of the autonomous-driving algorithm based on the interaction result.

In an embodiment, the obstacle resource pool includes a first cache and a second cache, the initial motion information includes initial location information, and the simulation test apparatus further includes a processing unit.

The processing unit is configured to perform hash processing on the ID of each of the N obstacles, to obtain an ID hash value of each obstacle, where the ID hash value of each obstacle indicates a storage space of motion information of the obstacle in a first cache.

The storage unit is configured to:

store the initial motion information of each of the N obstacles to a storage space indicated by the ID hash value of the obstacle in the first cache; and store, by using initial location information of each of the N obstacles as an index, the ID and the initial location information of each obstacle to the second cache.

In an embodiment, the obstacle resource pool includes the first cache and the second cache, and in terms of the obtaining motion information of a surrounding obstacle of the obstacle from the obstacle resource pool based on an ID of the first obstacle, the simulation test unit is configured to:

obtain the initial motion information of the first obstacle from the first cache based on an ID hash value of the first obstacle, where the initial motion information includes initial location information, and the ID hash value of the first obstacle is obtained by performing hash processing on the ID of the first obstacle; obtain IDs of S obstacles from the second cache based on the initial location information of the first obstacle, where the S obstacles are obstacles located in a preset area of the first obstacle, the preset area of the first obstacle is determined based on the initial location information of the first obstacle, and S is less than or equal to N; determine the surrounding obstacle of the first obstacle from the S obstacles based on a motion mode of the first obstacle, where the surrounding obstacle of the first obstacle is an obstacle that is among the S obstacles and that potentially interacts with the first obstacle when the first obstacle moves in the motion mode; and obtain the initial motion information of the surrounding obstacle from the first cache based on an ID hash value of the surrounding obstacle of the first obstacle, where the ID hash value of the surrounding obstacle of the first obstacle is obtained by performing hash processing on the ID of the surrounding obstacle of the first obstacle.

In an embodiment, the first motion information includes first location information, and in terms of the updating initial motion information of the first obstacle in the obstacle resource pool to the first motion information, the simulation test unit is configured to:

determine, from the second cache based on the initial location information of the first obstacle, an ID corresponding to the initial location information of the first obstacle, and update the initial location information of the first obstacle in the second cache to the first location information of the first obstacle if the ID corresponding to the initial location information of the first obstacle is the ID of the first obstacle; and update the initial motion information of the first obstacle in the first cache to the first motion information based on the ID hash value of the first obstacle.

In an embodiment, the first motion information includes the first location information, and in terms of obtaining first motion information of n obstacles from the obstacle resource pool based on location information of the ego vehicle, the simulation test unit is configured to:

determine IDs and first location information of M obstacles from the second cache based on the location information of the ego vehicle, where the M obstacles are obstacles located within a preset range of the ego vehicle, the preset range of the ego vehicle is determined based on the location information of the ego vehicle, and M is a positive integer less than or equal to N; determine the n obstacles from the M obstacles based on a preset interaction manner and the first location information of the M obstacles, where the n obstacles are the obstacles that potentially interact with the ego vehicle; and determine first motion information of each of the n obstacles from the first cache based on an ID hash value of each of then obstacles.

According to a third aspect, an embodiment of the application further provides a simulation test apparatus, the simulation test apparatus includes:

a memory and a processor coupled to the memory, where the memory stores instructions, and when executing the instructions, the processor performs a part or all of the first aspect.

According to a fourth aspect, an embodiment of the application provides a chip system, where the chip system is used in an electronic device; the chip system includes one or more interface circuits and one or more processors; the interface circuit and the processor are interconnected through a line; the interface circuit is configured to receive a signal from a memory of the electronic device, and send the signal to the processor, where the signal includes computer instructions stored in the memory; and when the processor executes the computer instructions, the electronic device performs a part or all of the method according to the first aspect.

According to a fifth aspect, an embodiment of the application provides a computer-readable storage medium. The computer storage medium stores a computer program, the computer program includes program instructions, and when the program instructions are executed by a processor, the processor is enabled to perform a part or all of the method according to the first aspect.

According to a sixth aspect, an embodiment of the application provides a computer program product, where the computer program product includes computer instructions. When the computer instructions are run on an electronic device, the electronic device is enabled to perform a part or all of the method according to the first aspect.

These aspects or other aspects of this application are more concise and understandable in descriptions of the following embodiments.

BRIEF DESCRIPTION OF DRAWINGS

To describe the technical solutions in embodiments of this application more clearly, the following briefly describes the accompanying drawings used in describing embodiments or the current technology. It is clear that the accompanying drawings in the following description show some embodiments of this application, and persons of ordinary skill in the art may still derive other drawings from these accompanying drawings without creative efforts.

FIG. 2 is a schematic flowchart of a method for testing an autonomous-driving algorithm according to an embodiment of this application;

DESCRIPTION OF EMBODIMENTS

Figure 1:
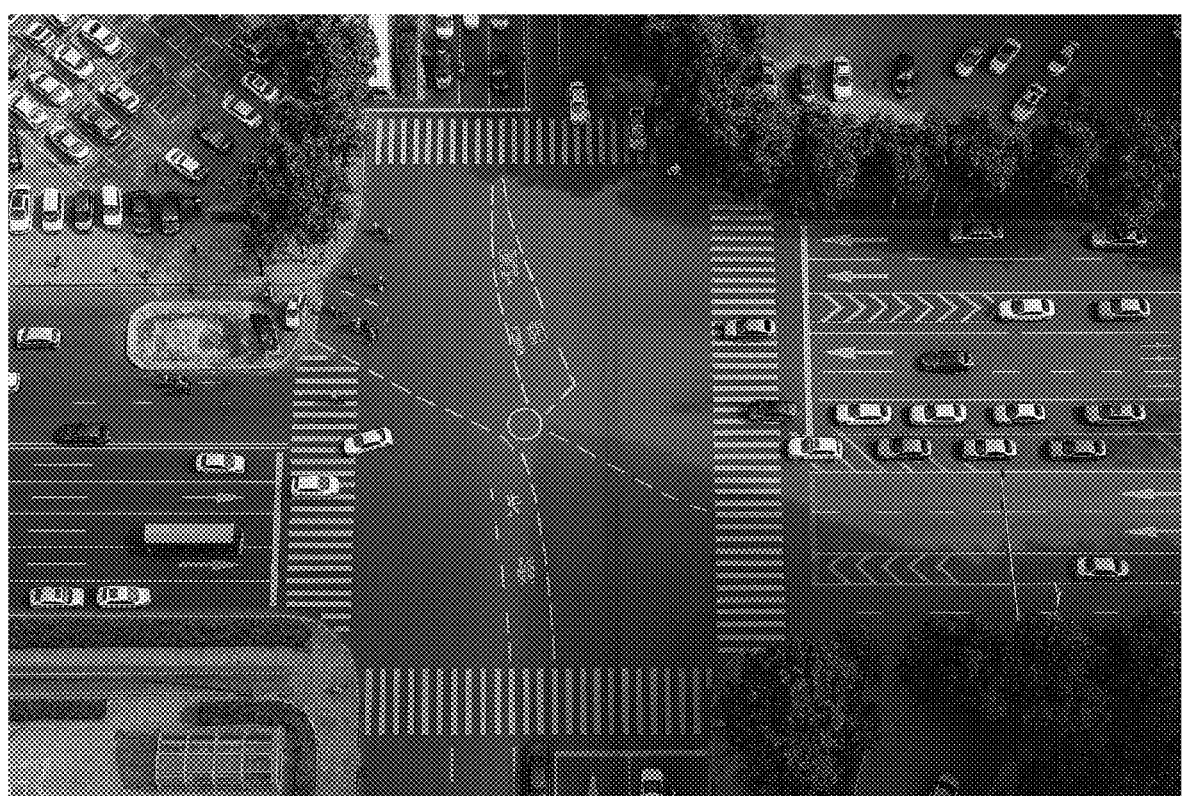
FIG. 1 is a schematic diagram of a traffic scenario at a crossroad.

The following describes embodiments of this application with reference to the accompanying drawings.

Key terms in this application are first explained.

Refined track obstacle: includes but is not limited to, an obstacle with attributes such as a type, a speed, coordinates of a start point, coordinates of a track point, and coordinates of an end point of an obstacle. In a test, this type of obstacles moves from the start point to the end point strictly based on a preset speed and a track point. Types of refined track obstacles include but are not limited to people, cars, trucks, bicycles, and electric vehicles.

Navigation-type obstacle: compared with refined track obstacles, the attributes of this type of obstacles include a type, a speed, a start point, and an end point. In a test scenario, this type of obstacles only need to move from the start point to the end point based on a preset upper speed limit. During this process, speeds and motion trajectories of the obstacles are dynamically adjusted based on interaction with other obstacles.

Macro traffic flow: refers to a flow of a vehicle formed by the continuous driving of cars on roads. Broadly speaking, the macro traffic flow also includes a flow of other vehicles and a flow of people. In a period of time, on a road section not affected by transverse intersection, the traffic flow is in a state of continuous flow. When encountering intersection signal light control, the traffic flow is in a state of intermittent flow. Attributes of the macro traffic flow include but are not limited to a quantity of obstacles, a type, a speed, a start point, and an end point of an obstacle.

Road test obstacle: refers to an obstacle measured by a vehicle driving in a real road test environment, where the obstacle includes a nearby motor vehicle, a pedestrian, a non-motorized vehicle, and the like in a driving process of the vehicle.

Refer to FIG. 2. FIG. 2 is a schematic flowchart of a method for testing an autonomous-driving algorithm according to an embodiment of this application. As shown in FIG. 2, this method includes the following operations.

S201. A simulation test apparatus obtains N obstacles from an obstacle set based on a test function of the autonomous-driving algorithm.

The N obstacles include an obstacle of an ego vehicle and a surrounding obstacle of the obstacle of the ego vehicle.

In an embodiment, after the N obstacles are obtained from the obstacle set, an ID is allocated to each of the N obstacles, and each obstacle is configured, to obtain the ID and configuration information of each obstacle. Alternatively, the obstacle set includes IDs and configuration information of various types of obstacles. Therefore, when the N obstacles are obtained from the obstacle set, it implicitly indicates that the IDs and configuration information of the N obstacles are obtained from the obstacle set, without additionally configuring the obstacles.

There are a part or all of the following types of obstacles in the plurality of obstacles: a refined track obstacle, a navigation-type obstacle, a macro traffic flow, and/or a road test obstacle.

For example, when there is a need to test whether an ego vehicle driving based on the autonomous-driving algorithm has functions such as normal lane changing, overtaking, intersection crossing, or roadside parking, a navigation-type obstacle needs to be introduced in the test scenario. For another example, when there is a need to test whether the ego vehicle driving based on the autonomous-driving algorithm can drive normally and compliantly in the case of an obstacle overtaking and cutting in (cut in), or the ego vehicle being cut out by an obstacle, the ego vehicle being squeezed, crossing an intersection, illegally going in the wrong direction, or running a red light, a refined track obstacle needs to be introduced in the test scenario. For another example, when there is a need to test whether the ego vehicle driving based on the autonomous-driving algorithm can normally and compliant drive in a traffic congestion situation, a macro traffic flow needs to be introduced in the test scenario to simulate the traffic congestion. For another example, when there is a need to test whether the ego vehicle driving based on the autonomous-driving algorithm can normally and compliant drive in a real environment, a road test obstacle obtained during a road test is introduced in the test scenario, to increase authenticity and randomness of a test scenario.

Further, the configuration information of the refined track obstacle includes but is not limited to a subtype, a speed, coordinates of a start point, coordinates of a track point, coordinates of an end point, and the like of an obstacle. The configuration information of the navigation-type obstacle includes but is not limited to a subtype, a speed, coordinates of a start point, coordinates of an end point, and the like of an obstacle. The configuration information of the macro traffic flow includes but is not limited to a quantity of obstacles, a subtype, a speed, coordinates of a start point, coordinates of an end point, and the like of an obstacle. The configuration information of the road test obstacle includes but is not limited to a subtype of an obstacle, a speed, a heading angle, and coordinates at each moment that are collected during a road test.

It should be noted herein that a subtype of an obstacle includes but is not limited to a pedestrian, an animal, a car, a bus, a truck, a bicycle, an electric vehicle, and the like.

In an embodiment, the macro traffic flow may be preset in an autonomous-driving algorithm simulation test apparatus, or may be obtained by a simulation test apparatus from another device. For example, the simulation test apparatus sends a macro traffic flow obtaining request to the another device, and the obtaining request includes the configuration information of the traffic flow. The another device generates the macro traffic flow based on the configuration information of the macro traffic flow, and sends the macro traffic flow to the simulation test apparatus, to respond to the macro traffic flow obtaining request.

In an embodiment, there are a plurality of functions of the autonomous-driving algorithm, such as parking and obstacle avoidance, overtaking, changing lanes to the left, changing lanes to the right, and vehicle following. When testing a function of an autonomous-driving algorithm, the simulation test apparatus may obtain a configuration file corresponding to the function. The configuration file includes the IDs and configuration information of the foregoing N obstacles, so that the N obstacles are obtained from the obstacle set based on the test function of the autonomous-driving algorithm, and the ID and configuration information of each of the N obstacles are obtained.

In an embodiment, the configuration file may be preset in the simulation test apparatus, or may be obtained by the simulation test apparatus from another device.

It should be noted herein that the simulation test apparatus may be a part of the ego vehicle or a dedicated test server. Certainly, this is merely an example, and is not a limitation on this application. Alternatively, the simulation test apparatus may be another device. Examples are not listed one by one herein.

S202. The simulation test apparatus stores initial motion information of each of the N obstacles to an obstacle resource pool.

The initial motion information of the N obstacles is obtained based on the configuration information of the first obstacle, and motion information of the obstacle includes but is not limited to a subtype, coordinates of a start point, coordinates of an end point, a current coordinate, a speed, a heading angle, and the like of the obstacle.

In an embodiment, after the configuration information of the N obstacles is obtained, configuration information of each of the N obstacles is parsed, to obtain initial motion information of the obstacle. By using the ID of each of the N obstacles as an index, the ID of each obstacle and the initial motion information of each obstacle are stored in the obstacle resource pool, to centrally manage the N obstacles.

In an embodiment, the obstacle resource pool includes a first cache and a second cache. After the configuration information of N obstacles is obtained, the configuration information of each of the N obstacles is parsed to obtain initial motion information of the obstacle. The initial motion information includes initial location information. Certainly, the location information may be coordinates, or may be other information. This is not limited in this application. Hash processing is performed on an ID of each of the N obstacles, to obtain an ID hash value of the obstacle, where the ID hash value indicates a storage space in the first cache, or the ID hash value may be considered as a storage address, and a storage space corresponding to the storage address is included in the first cache. Store initial motion information of each of the N obstacles in the storage space indicated by the ID hash value of the first obstacle. Then, by using the initial location information of each obstacle in the N obstacles as an index, the ID and the initial location information of each obstacle in the N obstacles are stored in the second cache of the obstacle resource pool, to centrally manage the N obstacles. In addition, when obstacles that interact with the obstacle or the ego vehicle is subsequently searched, the search is generally performed based on the location information. Therefore, in the second cache, IDs of the required obstacles may be quickly found based on the location information. Then, motion information of the obstacles can be found from the first cache based on the IDs of the obstacles, thereby improving search efficiency.

S203. The simulation test apparatus obtains initial motion information of a surrounding obstacle of a first obstacle from the obstacle resource pool based on an ID of the first obstacle, controls moving of the first obstacle based on the initial motion information of the surrounding obstacle of the first obstacle to obtain a first motion result of the first obstacle, and updates the initial location information of the first obstacle in the obstacle resource pool to the first motion result of the first obstacle.

In one example, in a test process, moving of a refined track obstacle is simulated based on a simple vehicle dynamics model and a Dubin's curve. The simple vehicle dynamics model is as follows:

$$\begin{cases} x = u_s \cos\theta \\ y = u_s \sin\theta \\ \theta = \dfrac{u_s}{L} \tan\phi \end{cases}$$

The origin of a vehicle body is located at the center of rear wheels of the vehicle, and an x-axis is along a main axis direction of the vehicle and is the same as the moving direction of the vehicle. A moving speed of the vehicle is $u_s$. A steering wheel angle is $\phi$, which is the same as that of front wheels. A distance between the centers of the front and rear wheels is L, and the heading deviation angle is $\theta$. Refined track obstacles such as cars, buses and trucks move in the above way.

For the navigation-type obstacle, in a test process, a location indicated by coordinates of a start point of the navigation-type obstacle is used as a start point, and a navigation path between a current location of the navigation-type obstacle and a location indicated by coordinates of an end point is planned in real time based on motion information of another obstacle in the test scenario. The navigation-type obstacle then follows the real-time planned path.

For the macro traffic flow, in a test process, the macro traffic flow uses a position indicated by coordinates of a start point in the motion information and a position indicated by coordinates of an end point in the motion information of the macro traffic flow as a start point and an end point respectively, and travels based on a speed in the motion information of the macro traffic flow.

The motion information of the road test obstacle includes a speed, a heading angle, and coordinates at each moment in the road test process. Therefore, to simulate a real driving environment, in the test process, the motion of the road test obstacle is controlled based on information such as the speed, the heading angle, and the coordinates in the motion information of the road test obstacle.

In an embodiment, when the motion of the obstacle is controlled, the motion of the obstacle may be controlled not only based on the motion information of the obstacle, but also based on the motion information and an action to be performed by the obstacle in a test process, to construct a more detailed test scenario.

In an embodiment, each of the N obstacles is processed in the following manner.

Initial motion information of a surrounding obstacle of a first obstacle from the obstacle resource pool is obtained based on an ID of the first obstacle. Moving of the first obstacle is controlled based on the initial motion information of the surrounding obstacle of the first obstacle, to obtain first motion information of the first obstacle. Initial motion information of the first obstacle in the obstacle resource pool is updated to the first motion information of the first obstacle. The first obstacle is any one of the N obstacles.

In the foregoing manner, motion information of each of the N obstacles in the obstacle resource pool may be updated.

In an embodiment, the obtaining initial motion information of a surrounding obstacle of a first obstacle from the obstacle resource pool based on an ID of the first obstacle includes the following.

The initial motion information of the first obstacle is obtained from the first cache of the obstacle resource pool based on an ID hash value of the first obstacle, where the ID hash value of the first obstacle is obtained by performing hash processing on the ID of the first obstacle. The initial motion information of the first obstacle includes initial location information of the first obstacle. IDs of S obstacles are determined from the second cache of the obstacle resource pool based on the initial location information of the first obstacle. The S obstacles are obstacles located within a preset range of the first obstacle. A preset area of the first obstacle is an area whose center is the position of the first obstacle and whose radius is R. Certainly, the preset area of the first obstacle may alternatively be a square area or a rectangular area centered on a location of the first obstacle. This is not limited herein. The preset area of the first obstacle may be referred to as a field of view of the first obstacle. It should be understood that when the S obstacles are determined from the second cache of the obstacle resource pool based on the initial location information of the first obstacle, the location of the first obstacle is a location indicated by the initial location information of the first obstacle. In an embodiment, the S obstacles are obstacles whose distances between locations in the second cache and locations indicated by initial location information of the first obstacle are less than a preset distance. The surrounding obstacle of the first obstacle is determined from the S obstacles based on a motion mode of the first obstacle, where the surrounding obstacle of the first obstacle is an obstacle that is among the S obstacles and that potentially interacts with the first obstacle when the first obstacle moves in the motion mode of the first obstacle. The initial motion information of the surrounding obstacle is obtained from the first cache based on an ID hash value of the surrounding obstacle of the first obstacle, where the ID hash value of the surrounding obstacle of the first obstacle is obtained by performing hash processing based on the ID of the surrounding obstacle of the first obstacle.

After the initial motion information of the surrounding obstacles of the first obstacle is obtained, the first obstacle is controlled to move based on the initial motion information of the surrounding obstacles of the first obstacle, and the first motion information of the first obstacle is obtained.

Figure 3A:
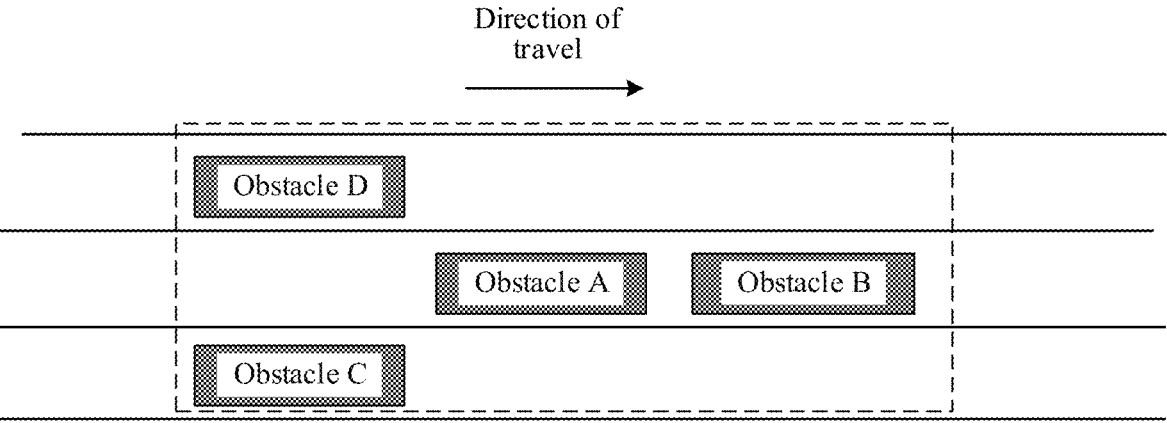
FIG. 3*a* is a schematic diagram of a field of view of an obstacle.

For example, as shown in FIG. 3a, any obstacle A in N obstacles is used as an example. An area in a dotted-line box is a preset area of the obstacle A, and obstacles located in the preset area of the obstacle A include an obstacle B, an obstacle C, and an obstacle D. Based on the location information of each of the obstacles A, B, C, and D, it may be determined that the obstacle B is located in front of the obstacle A, and the obstacle C and the obstacle D are respectively located at a right rear and a left rear of the obstacle A. It is assumed that the motion mode of the obstacle A is to change lanes to the left, and there is potential interaction between the obstacle D and obstacle A. Therefore, a surrounding obstacle of the obstacle A is the obstacle D. Based on the initial motion information of the obstacle D, it is determined whether the obstacle D is about to accelerate to overtake or keep a speed unchanged. If it is determined that the obstacle D is about to accelerate to overtake, the obstacle A is controlled to travel with keeping the speed and direction unchanged, to avoid collision with the obstacle D when the obstacle A changes lane. If it is determined that the speed of the obstacle D remains unchanged, the obstacle A is controlled to change lanes to the left, to complete an operation of changing lanes to the left. In addition, motion information of the obstacle A in this process is obtained, where the motion information is first motion information, and the first motion information includes first location information.

Figure 4:
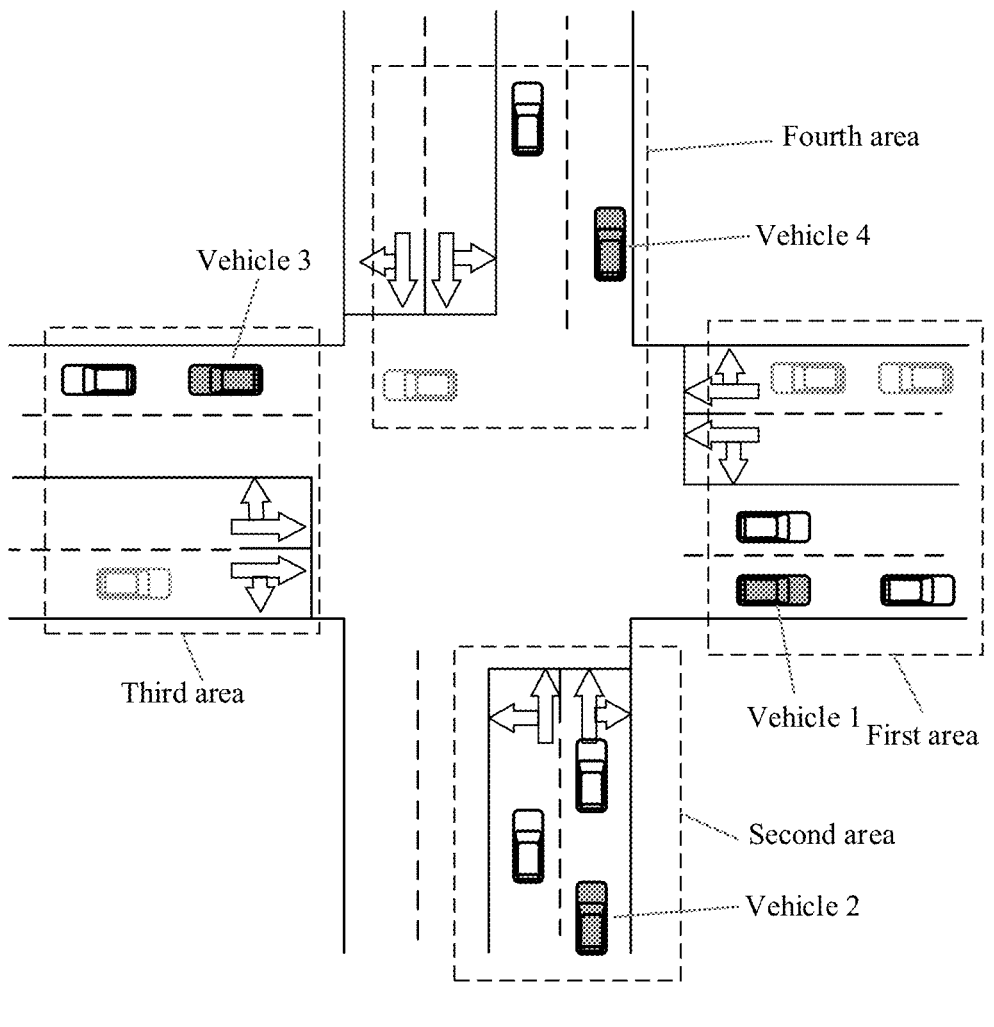
FIG. 4 is a schematic diagram of interaction between obstacles.

For another example, as shown in FIG. 4, for a vehicle 1, a vehicle 2, a vehicle 3, and a vehicle 4, preset areas of these vehicles are respectively a first area, a second area, a third area, and a fourth area shown in FIG. 4. For the vehicle 1, all vehicles other than the vehicle 1 in the first area may be considered as an obstacle in a field of view of the vehicle 1, and may be determined from the second cache of the obstacle resource pool based on location information of the vehicle 1. A vehicle (a vehicle with a black line and a white background) that travels in the same direction as the vehicle 1 in the first area and is located on the left side and in front of the vehicle 1 affects driving of the vehicle 1, and a vehicle with a gray line and a white background does not affect driving of the vehicle 1. The vehicle with the black line and the white background is a target obstacle of the vehicle 1. Therefore, the vehicle with the black line and the white background in the first area is a surrounding obstacle of the vehicle 1.

For the vehicle 2, all vehicles other than the vehicle 2 in the second area may be considered as an obstacle in a field of view of the vehicle 2, and may be determined from the second cache of the obstacle resource pool based on location information of the vehicle 2. A vehicle (a vehicle with a black line and a white background) that travels in the same direction as the vehicle 2 and is located in the upper left corner and in front of the vehicle 2 in the second area affects driving of the vehicle 2. The vehicle with the black line and the white background is a surrounding obstacle of the vehicle 2. Therefore, the vehicle with the black line and white background in the second area is the surrounding obstacle of the vehicle 2.

For the vehicle 3, all vehicles other than the vehicle 3 in the third area may be considered as an obstacle in a field of view of the vehicle 3, and may be determined from the second cache of the obstacle resource pool based on location information of the vehicle 3. A vehicle (a vehicle with a black line and a white background) that is located in a same lane as the vehicle 3 and in front of the vehicle 3 in the third area affects driving of the vehicle 3, and a vehicle with a gray line and a white background does not affect driving of the vehicle 3. The vehicle with the black line and the white background is a surrounding obstacle of the vehicle 3. Therefore, the vehicle with the black line and the white background in the third area is the surrounding obstacle of the vehicle 3.

For the vehicle 4, all vehicles other than the vehicle 4 in the fourth area may be considered as an obstacle in a field of view of the vehicle 4, and may be determined from the second cache of the obstacle resource pool based on location information of the vehicle 4. A vehicle (a vehicle with a black line and a white background) that travels in the same direction as the vehicle 4 and is located in the upper left corner of the vehicle 4 in the fourth area affects driving of the vehicle 4, and a vehicle with a gray line and a white background does not affect driving of the vehicle 4. The vehicle with the black line and the white background is a surrounding obstacle of the vehicle 4. Therefore, the vehicle with the black line and the white background in the fourth area is the surrounding obstacle of the vehicle 4.

After the surrounding obstacles of the vehicle 1, the vehicle 2, the vehicle 3, and the vehicle 4 are obtained based on the foregoing method, first motion information of the surrounding obstacles of the vehicle 1, the vehicle 2, the vehicle 3, and the vehicle 4 is obtained from the obstacle resource pool based on IDs of the surrounding obstacles of these vehicles.

After the first motion information of the first obstacle is obtained, initial motion information of the first obstacle is obtained from the first cache of the obstacle resource pool based on the ID hash value of the first obstacle, where the initial motion information includes initial location information. An ID corresponding to the initial location information is obtained from the second cache of the obstacle resource pool based on the initial location information. If the ID is an ID of a first obstacle, location information corresponding to the ID in the second cache is updated to the first location information. The initial motion information of the first obstacle in the first cache is updated to the first motion information of the first obstacle, to manage the N obstacles based on the obstacle resource pool.

For another example, as shown in FIG. 3*a*, an obstacle A is any one of N obstacles, an area in a dotted line box is a preset area of the obstacle A, and obstacles located in the preset area of the obstacle A include an obstacle B, an obstacle C, and an obstacle D. The obstacle B, the obstacle C, and the obstacle D are obstacles in the field of view of the obstacle A. Based on the location information of each of the obstacles A, B, C, and D, it may be determined that the obstacle B is located in front of the obstacle A, and the obstacle C and the obstacle D are respectively located at a right rear and a left rear of the obstacle A. It is assumed that the obstacle A is a navigation-type obstacle, and a track of the navigation-type obstacle is not fixed. Therefore, a motion mode of the obstacle A may be to change lanes to the left, and a target obstacle of the obstacle A is the obstacle D. Based on the motion information of the obstacle D, it is determined whether the obstacle D is about to accelerate to overtake or keep a speed unchanged. If it is determined that the obstacle D is about to accelerate to overtake, the obstacle A is controlled to travel with keeping the speed and direction unchanged, to avoid collision with the obstacle D when the obstacle A changes lane. If it is determined that the speed of the obstacle D remains unchanged, the obstacle A is controlled to change lanes to the left, to complete an operation of changing lanes to the left. It is assumed that the obstacle A is a refined track obstacle, and a driving track of the refined track obstacle is fixed. Therefore, a motion mode may be vehicle following, and a target obstacle of the obstacle A is the foregoing obstacle B. Based on the motion information of the obstacle B, it is determined whether the obstacle B travels at an accelerated speed or at a decelerated speed. If it is determined that the obstacle B travels at the accelerated speed, the obstacle A is controlled to travel at an accelerated speed. If it is determined that the obstacle B travels at the decelerated speed, the obstacle A is controlled to travel at a decelerated speed, to avoid rear-end collision with the obstacle A. It is assumed that the obstacle A and the obstacle B are adjacent obstacles in the macro traffic flow. For the obstacle A, a preset interaction manner of the obstacle A is vehicle following, and a third obstacle of the obstacle A is the obstacle B. Based on the motion information of the obstacle B, it is determined whether the obstacle B travels at an accelerated speed or at a decelerated speed. If it is determined that the obstacle B travels at the accelerated speed, the obstacle A is controlled to travel at an accelerated speed. If it is determined that the obstacle B travels at the decelerated speed, the obstacle A is controlled to travel at a decelerated speed.

After the obstacle A is controlled to move in the foregoing manner, the motion information of the obstacle A is obtained, and the motion information of the obstacle A is updated to the first motion information of the obstacle A in the obstacle resource pool according to the foregoing method.

Interaction between obstacles is introduced, so that a real driving scenario can be more realistically simulated, and a test result of the autonomous-driving algorithm is more accurate.

S204. The simulation test apparatus obtains first motion information of n obstacles from an obstacle resource pool based on the location information of an ego vehicle, where the n obstacles are obstacles of the ego vehicle, and n is less than or equal to N.

For example, IDs and first motion information of M obstacles are determined from the second cache of the obstacle resource pool based on the location information of the ego vehicle. The M obstacles are obstacles located within a preset range of the ego vehicle, and M is less than or equal to N. The n obstacles are determined from the M obstacles based on a preset interaction manner of the ego vehicle and the first location information of the M obstacles, where the n obstacles are obstacles that potentially interact with the ego vehicle. First motion information of each of then obstacles is determined from the first cache based on an ID hash value of each of the n obstacles.

In an embodiment, the preset area of the ego vehicle may be in a circular area whose center is coordinates of the ego vehicle and whose radius is r, or in a square area, or certainly may be in another irregular shape. The n obstacles are determined from the M obstacles based on the preset interaction manner of the ego vehicle and the first location information of the M obstacles, where the n obstacles are obstacles that potentially interact with the ego vehicle. For example, when the preset interaction manner is that the ego vehicle travels forward, the obstacle that potentially interacts with the ego vehicle is an obstacle located in front of the ego vehicle. For another example, when the preset interaction manner is that the ego vehicle is about to change lanes to the right, the obstacle that potentially interacts with the ego vehicle is an obstacle located on a right side and a right rear side of the ego vehicle. For another example, when the preset interaction manner is that the ego vehicle is about to change lanes to the left, the obstacle that potentially interacts with the ego vehicle is an obstacle located on a left side and a left rear side of the ego vehicle. For another example, when the preset interaction manner is that the ego vehicle is reversing, the obstacle that potentially interacts with the ego vehicle is an obstacle located in the rear of the ego vehicle.

Figure 3B:
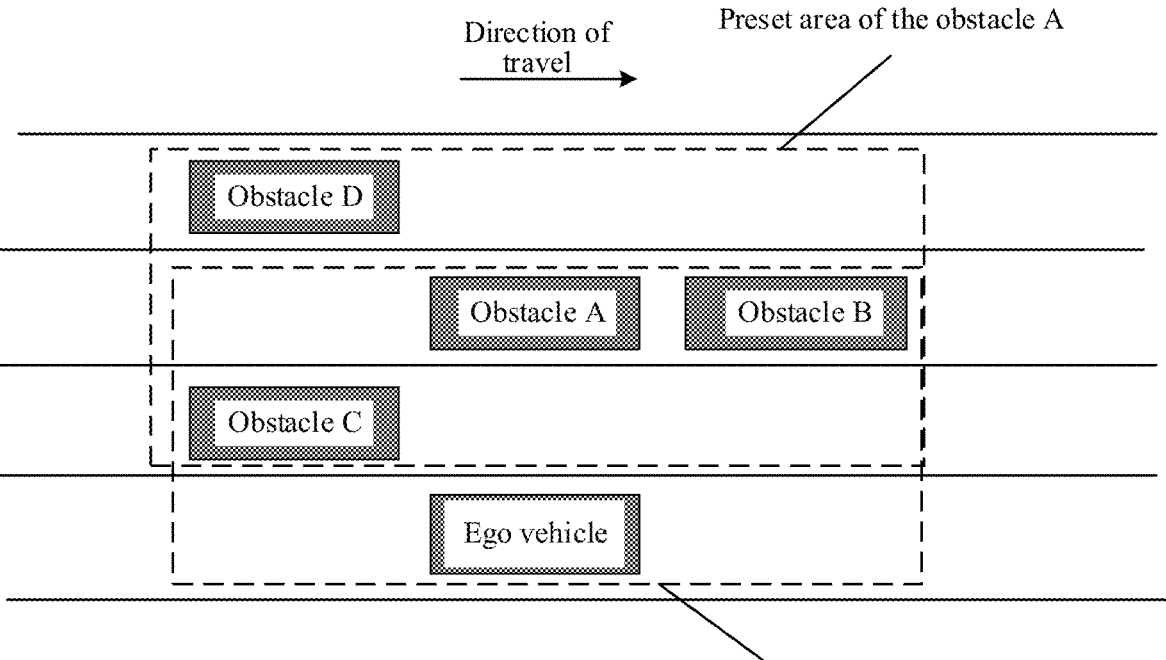
FIG. 3*b* is a schematic diagram of a field of view of an ego vehicle and a field of view of an obstacle.

For example, as shown in FIG. 3b, obstacles located in the preset area of an obstacle A include an obstacle B, an obstacle C, and an obstacle D. Based on the location information of each of the obstacles A, B, C, and D, it may be determined that the obstacle B is located in front of the obstacle A, and the obstacle C and the obstacle D are respectively located at a right rear and a left rear of the obstacle A. It is assumed that the motion mode of the obstacle A is to change lanes to the right, and there is potential interaction between the obstacle C and the obstacle A. Therefore, the surrounding obstacle of the obstacle A is the obstacle C. Based on the initial motion information of the obstacle C, it is determined that the obstacle C travels at a constant speed, and the obstacle A is controlled to change lanes to the right. For the ego vehicle, obstacles within a preset range include the obstacle A, the obstacle B, and the obstacle C. It is assumed that a preset interaction manner of the ego vehicle is to change lanes to the left, the obstacles that potentially interact with the ego vehicle include the obstacle A and the obstacle C. The n obstacles include the obstacle A and the obstacle C.

It should be noted herein that, in a process of testing the autonomous-driving algorithm, motion information of both the N obstacles and the ego vehicle is changing. To better manage obstacles based on the obstacle resource pool, the motion information of N obstacles in the obstacle resource pool is updated in real time.

In a test process, the motion information of the N obstacles in the obstacle resource pool is updated in real time, which is implemented in the following manner.

Second motion information of the first obstacle is obtained in real time, where the second motion information includes second location information, and the second location information is real-time location information of the first obstacle. Then, a storage location of the motion information of the first obstacle is determined from the first cache of the obstacle resource pool based on the ID hash value of the first obstacle, to obtain historical motion information of the first obstacle, where the historical motion information includes historical location information. An ID corresponding to the historical location information is obtained from the second cache based on historical location information of the first obstacle. If the ID corresponding to the historical location information of the first obstacle is the ID of the obstacle, the second location information of the first obstacle in the second cache is updated to the historical location information of the first obstacle, and the historical motion information of the first obstacle that is stored in the storage location indicated by the ID hash value of the first obstacle in the first cache is updated to second motion information of the obstacle. The first obstacle is any one of the N obstacles.

According to a manner of updating the motion information of the first obstacle in the obstacle resource pool, the motion information of each of the N obstacles in the obstacle resource pool is updated.

To increase richness and randomness of the test scenario, obstacles may be added based on preset manners or user instructions. The preset manners may be the following manners. If the ego vehicle does not interact with an obstacle within the preset duration, some obstacles interacting with the ego vehicle are automatically added, where the obstacle may be a refined track obstacle, a navigation-type track obstacle, a macro traffic flow, a road test obstacle, or another obstacle. The ID and configuration information of the newly added obstacle are obtained based on the preset manners or the user instructions. The configuration information of the newly added obstacle is parsed to obtain initial motion information of the newly added obstacle, where the initial motion information includes initial location information of the newly added obstacle. Hash processing is performed on the ID of the newly added obstacle, to obtain an ID hash value of the newly added obstacle. The initial motion information of the newly added obstacle is stored to a storage space indicated by the ID hash value of the newly added obstacle in the first cache. The ID and the initial motion information of the newly added obstacle are stored to the second cache of the obstacle resource pool by using the initial location information of the newly added obstacle as an index. In addition, in a subsequent process, related information of the newly added obstacle in the obstacle resource pool may be updated in the foregoing manner.

In an embodiment, in a test process, there may be some obstacles that do not interact with the ego vehicle in a subsequent test process, or there may be some obstacles that do not interact with the second obstacle in the obstacle resource pool. The second obstacle is an obstacle that potentially interacts with the ego vehicle in the subsequent test process. To reduce management overheads of the obstacle resource pool, related information of these obstacles needs to be deleted from the obstacle resource pool. A manner of deletion may be as follows. An ID of an obstacle that needs to be deleted is obtained. Hash processing is performed on the ID of the obstacle that needs to be deleted to obtain an ID hash value of the obstacle that needs to be deleted. Motion information of the obstacle is obtained from the first cache of the obstacle resource pool based on the ID hash value of the obstacle that needs to be deleted, where the motion information includes location information. An ID corresponding to the location information is obtained from the second cache based on the location information, and then the ID and the location information corresponding to the ID are deleted from the second cache. In an embodiment, because update times of location information of different obstacles in the second cache are inconsistent, there may be a plurality of obstacles having same location information. For example, at a moment t1, location information of an obstacle z1 and an obstacle z2 is ad1 and ad2 respectively. At the moment t2, the location information of the obstacle z1 is updated from ad1 to ad2, and the location information of the obstacle z2 is not updated. In this case, in the second cache, the location information of the obstacle z1 is the same as the location information of the obstacle z2. IDs of obstacles may be obtained from the second cache based on the location information ad2: z1 and z2. Therefore, the location information and the ID of the obstacle that needs to be deleted are deleted from the second cache based on the ID of the obstacle that needs to be deleted, and the motion information of the obstacle that needs to be deleted is deleted from the first cache based on the ID hash value of the obstacle that needs to be deleted.

In an embodiment, a manner of the deletion may be as follows. An ID of an obstacle that needs to be deleted is obtained. The hash processing is performed on an ID of the obstacle that needs to be deleted to obtain an ID hash value of the obstacle that needs to be deleted. Motion information of the obstacle that needs to be deleted is obtained from the first cache of the obstacle resource pool based on the ID hash value of the obstacle that needs to be deleted, where the motion information includes location information. The ID corresponding to the location information is obtained from the second cache based on the location information. Because storage precision of the same location information in the first cache may be different from that in the second cache, the ID corresponding to the location information cannot be determined from the second cache based on the location information obtained from the first cache. Therefore, one or more IDs are obtained from the second cache based on the location information obtained from the first cache, where an absolute value of a difference between location information corresponding to the one or more IDs and the location information obtained from the first cache is less than a preset distance. Then, among the one or more IDs and the location information corresponding to the one or more IDs, an ID that is the same as the ID of the obstacle that needs to be deleted and location information corresponding to the ID are deleted from the second cache.

An obstacle resource pool is introduced in a simulation test scenario to centrally manage obstacles in the simulation test scenario.

Figure 6:
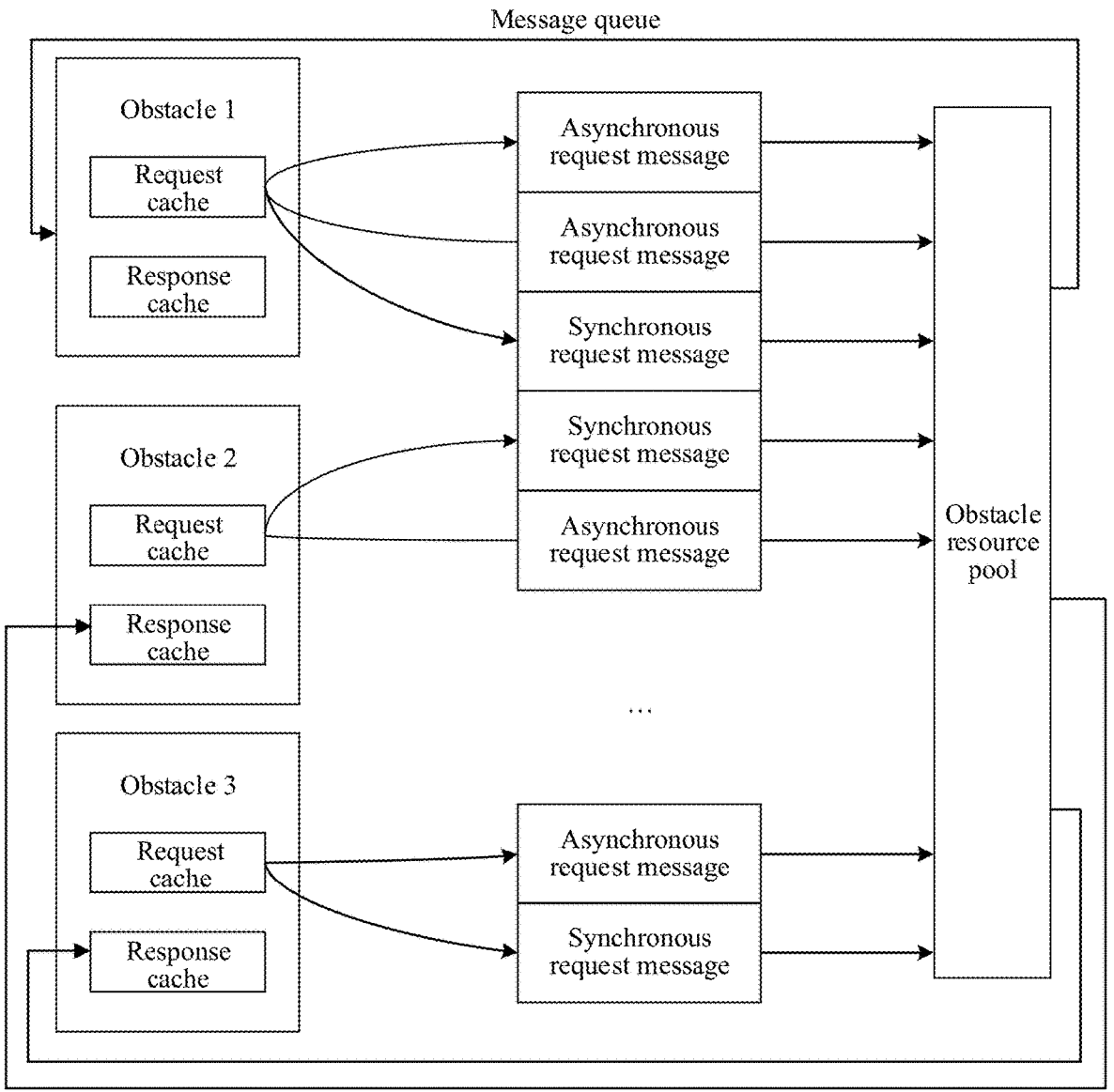
FIG. 6 is a schematic diagram of a data channel.

It should be noted that, for any obstacle X in the test scenario, the obstacle X may be considered as a function or a model from a perspective of the simulation test apparatus. The function or the model runs on a CPU of the simulation test apparatus, and the obstacle resource pool is stored in a running memory. The running memory includes a message queue. In a test process, motion information of the obstacle X needs to be sent to the obstacle resource pool in real time, and a third obstacle in a preset area of the obstacle X may be obtained from the obstacle resource pool, or motion information of any obstacle may be obtained from the obstacle resource pool. For example, the CPU sends a report message to the running memory, where the report message carries an ID hash value of the obstacle X and real-time motion information of the obstacle X. The running memory stores the report message in a message queue. The CPU may further send a first obtaining request message to the running memory. The first obtaining request message is used to request to obtain an ID of an obstacle within a preset range of the obstacle X. The first obtaining request message carries an ID hash value of the obstacle X. The running memory stores the first obtaining request message in the message queue. The CPU may further send a second obtaining request message to the running memory. The second obtaining request message is used to request to obtain motion information of an obstacle E. The second obtaining request message carries the ID hash value of the obstacle E. The running memory can read messages from the message queue in sequence or in parallel and perform corresponding operations. For example, if a report message is read, the running memory stores the carried real-time motion information to the obstacle resource pool based on the ID hash value carried in the report message. If the first obtaining request message is read, the running memory obtains motion information of the obstacle X from the first cache of the obstacle resource pool based on the ID hash value of the obstacle X, where the motion information includes location information. Then, an ID of an obstacle located within a preset range of the obstacle X is obtained from the second cache based on the location information of the obstacle X. After the ID of the obstacle within the preset range of the obstacle X is obtained by the running memory, a response message is sent to the CPU, where the response message carries the ID of the obstacle within the preset range of the obstacle X. If the second obtaining request message is read, the running memory obtains the motion information of the obstacle E from the first cache in the obstacle resource pool based on the ID hash value of the obstacle E, and sends second response message that carries the motion information of the obstacle E to the CPU. The report message does not require a response. Therefore, the report message can be considered as an asynchronous request message. The first obtaining request message and the second obtaining request message require a response. Therefore, the first obtaining request message and the second obtaining request message may be considered as synchronous request messages, as shown in FIG. 6. After the running memory executes a corresponding operation on any message, the running memory deletes the message from the message queue. The foregoing message queue may be considered as a data channel between an obstacle and an obstacle resource pool. Parallel processing of a plurality of report messages or a plurality of request messages ensures efficient and low latency of data channel communication between a resource pool and an obstacle.

When it is determined that a request message related to the obstacle X needs to be sent, where the request message includes information about the obstacle X, including but not limited to an ID hash value of the obstacle X, a location of the obstacle X, and information about the obstacle in a field of view. The information about the obstacle X is stored in the request cache of the obstacle X, and is packed into a report message or a request message. For the request message, after obtaining a corresponding response message, the CPU stores the response message to the response cache of the obstacle X, as shown in FIG. 6.

In an embodiment, the first obtaining request message is used to request to obtain an ID of an obstacle in the field of view, or to obtain motion information of an obstacle in the field of view. When the motion information of the obstacle in the field of view is requested to be obtained, after a target obstacle is determined from the obstacles based on the ID in the field of view, a request message used to request to obtain motion information of the target obstacle needs to be sent again.

In the foregoing manner, interaction between a plurality of obstacles, for example including, a refined track obstacle, a navigation-type obstacle, a macro traffic flow, and a road test obstacle can be implemented, so that a real driving environment is more realistically simulated, and accuracy of a test result of the autonomous-driving algorithm is improved.

S205. Obtain a result of interaction between the ego vehicle and then obstacles based on the first motion information of the n obstacles, and determine a test result of the autonomous-driving algorithm based on the interaction result.

The interaction result includes but is not limited to safe vehicle following, rear-end collision, safe overtaking, overtaking collision, obstacle avoidance failure and obstacle collision, obstacle avoidance success, and the like.

For example, as shown in FIG. 3b, obstacles located in the preset area of an obstacle A include an obstacle B, an obstacle C, and an obstacle D. Based on the location information of each of the obstacles A, B, C, and D, it may be determined that the obstacle B is located in front of the obstacle A, and the obstacle C and the obstacle D are respectively located at a right rear and a left rear of the obstacle A. It is assumed that the motion mode of the obstacle A is to change lanes to the right, and there is potential interaction between the obstacle C and the obstacle A. Therefore, the surrounding obstacle of the obstacle A is the obstacle C. Based on the initial motion information of the obstacle C, it is determined that the obstacle C travels at a constant speed, and the obstacle A is controlled to change lanes to the right. For the ego vehicle, obstacles within a preset range include the obstacle A, the obstacle B, and the obstacle C. It is assumed that a preset interaction manner of the ego vehicle is to change lanes to the left, the obstacles that potentially interact with the ego vehicle include the obstacle A and the obstacle C. Based on the motion information of the obstacle C, it is determined that a speed of the obstacle C remains unchanged. If the ego vehicle changes lane to the right, the result of interaction between the ego vehicle and the obstacle includes that the ego vehicle collides with the obstacle A, and that the ego vehicle collides with the obstacle C. If the ego vehicle keeps the speed and direction unchanged, the result of interaction between the ego vehicle and the obstacle includes that neither the ego vehicle collides with the obstacle A nor the obstacle C.

Figure 5:
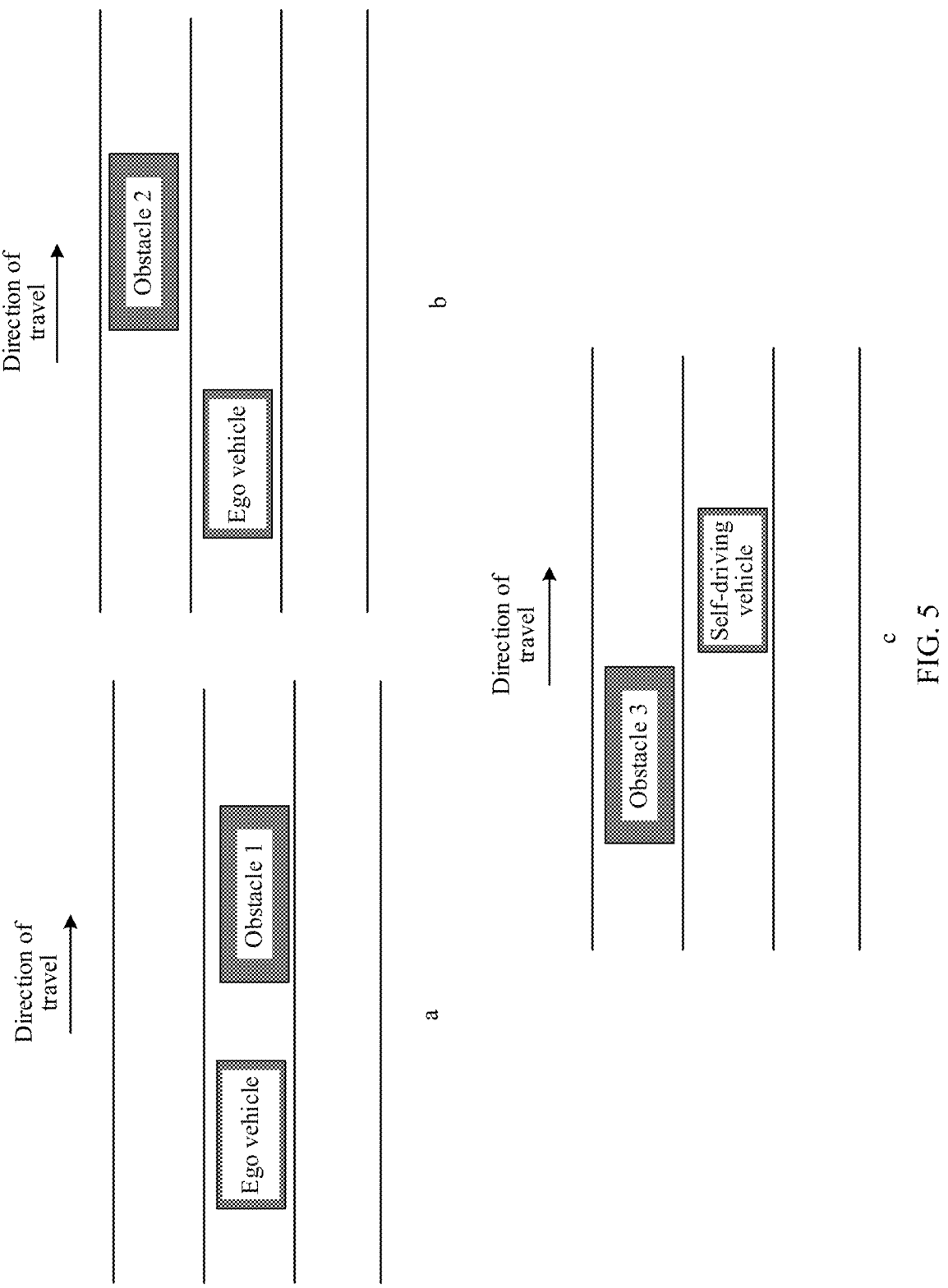
FIG. 5 is a schematic diagram of interaction between an ego vehicle and an obstacle.

For another example, the ego vehicle travels forward, and the second obstacle is an obstacle located in front of the ego vehicle. One or more second obstacles may be determined from the plurality of obstacles based on coordinates of the ego vehicle and coordinates of the plurality of obstacles. The second obstacle is an obstacle in front of the ego vehicle among the plurality of obstacles. Assuming that the preset interaction action is the vehicle following, the third obstacle is an obstacle located in a same lane as the ego vehicle. As shown in FIG. 5, the third obstacle is an obstacle 1. Assuming that it is determined, based on the motion information of the obstacle 1, that the obstacle 1 is decelerating, and that the ego vehicle is accelerating or the speed remains unchanged at this time, then it is determined that the interaction result is rear-end collision. Assuming that it is determined, based on the motion information of the obstacle 1, that the obstacle 1 is accelerating, and that the ego vehicle is decelerating or the speed remains unchanged at this time, it is determined that the interaction result is a vehicle following failure.

It is assumed that the preset interaction action is that the ego vehicle travels forward. As shown in FIG. b in FIG. 5, the third obstacle is the obstacle 2, and it is determined, based on motion information of the obstacle 2, that the obstacle 2 is about to be inserted into the lane. In this case, the ego vehicle may be controlled to accelerate and overtake, to decelerate and avoid, or to stop and avoid. The interaction result may be accelerated safe passage, accelerated overtaking collision, and successful deceleration or parking avoidance.

It is assumed that the preset interaction action is to change lanes to the right, and the third obstacle is an obstacle located in the left rear and rear, for example, an obstacle 3 shown in FIG. c in FIG. 5. Based on motion information of the obstacle 3, it is determined that the obstacle 3 travels at a constant speed. In this case, the ego vehicle can change lanes to the left and accelerate, and the interaction result may be that the lanes changing to the left is successful.

According to the foregoing manner, a result of interaction between the ego vehicle and the obstacle may be obtained.

In an embodiment, the ego vehicle and the obstacles in the field of view of the ego vehicle are displayed in real time on a display interface of the simulation test apparatus. Alternatively, the ego vehicle and the N obstacles are displayed in real time.

In an example, the interaction result may be analyzed from any dimension or a combination of a plurality of dimensions of task completion, compliance with a traffic rule, safety, vehicle comfort, and traffic efficiency, to determine a test result of the autonomous-driving algorithm. The test result includes a passed test and a failed test.

In an embodiment, the interaction result may be classified into safe driving and dangerous driving. The number of safe driving times and the number of dangerous driving times in the interaction result is respectively counted, and then a proportion of safe driving is calculated based on the number of safe driving times and the number of dangerous driving times. When the proportion of safe driving is higher than a preset proportion, it is determined that the autonomous-driving algorithm has passed the test. When the proportion of safe driving is not higher than the preset proportion, it is determined that the autonomous-driving algorithm has passed the test.

Certainly, the interaction result may further be based on any dimension of task completion degree of the autonomous-driving algorithm, compliance with a traffic rule, vehicle comfort, and traffic efficiency. Certainly, the interaction result may be further analyzed based on a plurality of dimensions of task completion, compliance with a traffic rule, vehicle comfort, and traffic efficiency, to determine whether the autonomous-driving algorithm passes the test.

In an embodiment, the function of overtaking and grabbing a lane on a navigation-type obstacle by the ego vehicle is tested in the background of a macro traffic flow, and operations include the following operations.

S801. Deploy a refined track obstacle in a test scenario.

For example, configuration information of the refined track obstacle is obtained, where the configuration information of the refined track obstacle includes but is not limited to a subtype, coordinates of a start point, coordinates of an end point, a driving track point coordinate, and a speed of the obstacle, and the subtype of the obstacle is an automobile. Based on the configuration information, a vehicle dynamics model and a Dubin's curve are used to control moving of the refined track obstacle during the test. For the vehicle dynamics model, reference may be made to the related description in the foregoing embodiment, which is not described herein again.

S802. Deploy a navigation-type obstacle in the test scenario.

Figure 8:
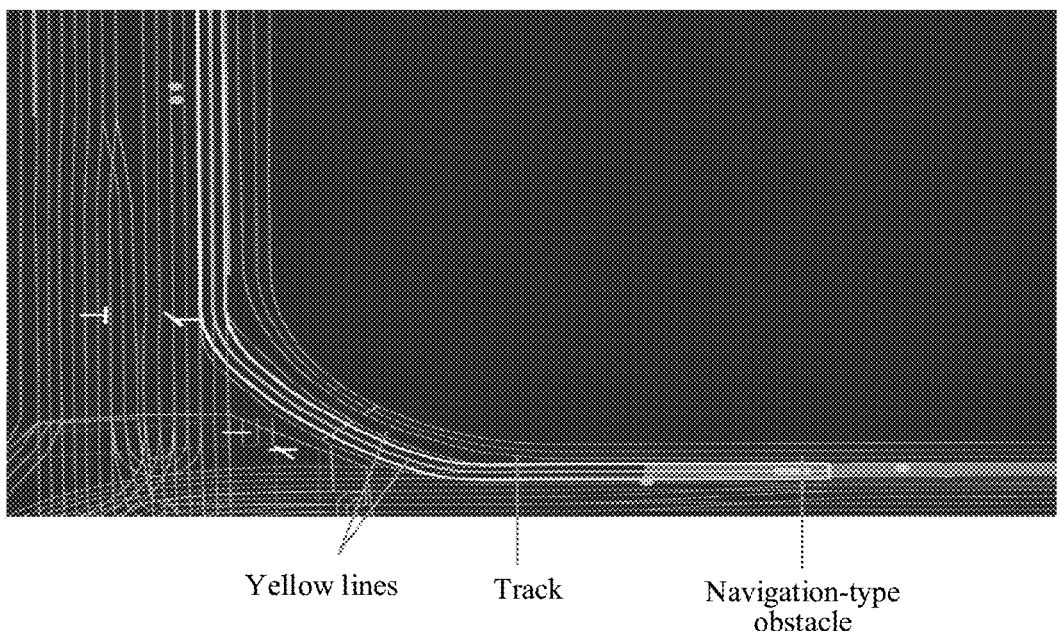
FIG. 8 is a schematic diagram of a field of view of a navigation-type obstacle.

For example, configuration information of the navigation-type obstacle is obtained, where the configuration information includes but is not limited to a subtype, a speed, coordinates of a start point, and coordinates of an end point of the obstacle. Based on the coordinates of the start point and the coordinates of the end point, a driving path is planned for the navigation-type obstacle. During the test, the navigation-type obstacle can avoid obstacles, change lanes, and interact with other obstacles. For example, when the navigation-type obstacle is driving, if there is an obstacle in front of the navigation-type obstacle that affects the driving, the navigation-type obstacle stops or changes lane, which reflects interaction between obstacles. As shown in FIG. 8, an area within the two yellow lines is a field of view of the navigation-type obstacle, and a line within the two yellow lines is a track line of the navigation-type obstacle.

S803. Deploy a macro traffic flow in a test scenario.

For example, configuration information of the macro traffic flow is obtained, where the configuration information includes but is not limited to a quantity of obstacles, a subtype, a speed, coordinates of a start point, coordinates of an end point, and the like of an obstacle. The configuration information of the macro traffic flow may be obtained by parsing an imported configuration file, or may be input by a user. After the configuration information is obtained, the configuration information is sent to accessed third-party traffic flow software. The third-party traffic flow software generates a macro traffic flow based on the input configuration information, and inputs the generated macro traffic flow into simulation test software. Deploying the macro traffic flow in the test scenario is completed.

S804. Build a data channel for performing data exchange between the obstacle resource pool and the obstacle.

It should be noted herein that, for the related description of the data channel, reference may be made to the description of FIG. 6, which is not described herein again.

Parallel processing of a plurality of report messages or a plurality of request messages ensures high efficiency and low latency of communication between the resource pool and the obstacle.

S805. By using an ID of the obstacle as key information, use a hash algorithm to store information about the obstacle.

For example, initial motion information of the refined track obstacle, initial motion information of the navigation-type obstacle and initial motion information of the macro traffic flow are respectively parsed from the configuration information of the refined track obstacle, the configuration information of the navigation-type obstacle and the configuration information of the macro traffic flow. Motion information about these obstacles is stored to the obstacle resource pool by using IDs of these obstacles as indexes.

In an embodiment, hash processing is performed on the ID of the refined track obstacle, the ID of the navigation-type obstacle, and the ID of the macro traffic flow, respectively, to obtain an ID hash value of the refined track obstacle, an ID hash value of the navigation-type obstacle, and an ID hash value of the macro traffic flow. The initial motion information of the obstacles is stored to a storage space indicated by the ID hash value of the obstacles in the first cache of the obstacle resource pool. By using the initial location information of these obstacles as an index, location information and the IDs of these obstacles are stored to the second cache of the obstacle resource pool. The obstacle resource pool is introduced, so that obstacles in a test scenario are centrally managed.

In an embodiment, in a test process, motion information of an obstacle in a test scenario is changing. To facilitate the obstacle resource pool to manage the obstacle in the test scenario, motion information of each obstacle in the test scenario is obtained in real time, and the motion information of the obstacle in the obstacle resource pool is updated. In an embodiment, refer to related descriptions of operation S203.

In an embodiment, in a test process, to increase complexity of a test scenario, a new obstacle may be added to the test scenario based on user instructions, and an ID and motion information of the newly added obstacle are stored to the obstacle resource pool for ease of management. In an embodiment, refer to related descriptions of operation S203. The newly added obstacle may be a part or all of a refined track obstacle, a navigation-type obstacle, a macro traffic flow, and/or a road test obstacle.

In an embodiment, in a test process, obstacles that do not affect driving of the ego vehicle exist in the test scenario. For these obstacles, motion information of these obstacles may be deleted from the obstacle resource pool based on IDs of these obstacles. In an embodiment, reference may be made to related descriptions of operation S203, so that these obstacles are deleted from the test scenario. These obstacles may be a part or all of a refined track obstacle, a navigation-type obstacle, a macro traffic flow, and/or a road test obstacle.

S806. Obtain an obstacle and motion information of the obstacle in the field of view of the navigation-type obstacle from the obstacle resource pool based on the ID of the navigation-type obstacle. Then, a target obstacle and motion information of the target obstacle are determined from the obstacle in the field of view of the navigation-type obstacle based on motion mode of the navigation-type obstacle, and moving of the navigation-type obstacle is controlled based on the motion information of the target obstacle.

Figure 9:
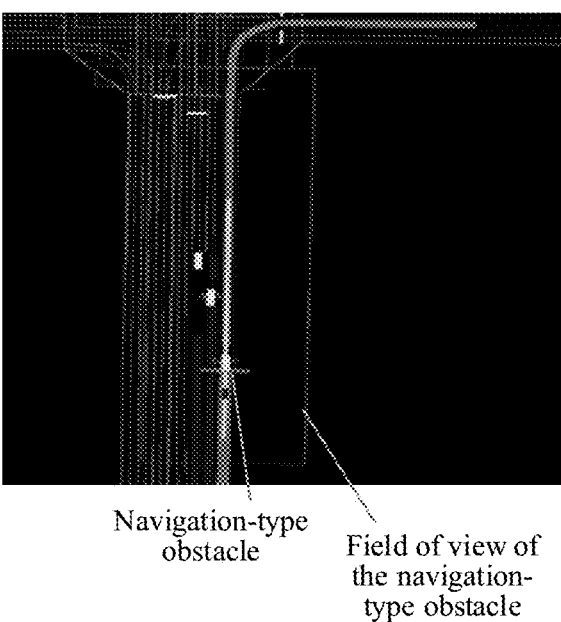
FIG. 9 is a schematic view of a field of view of a navigation-type obstacle.

For example, the CPU sends an obtaining request message that carries the ID hash value of a navigation-type obstacle to the running memory, where the obtaining request message is used to request to obtain an obstacle in the field of view of the navigation-type obstacle. The running memory obtains motion information of the navigation-type obstacle from the first cache of the obstacle resource pool based on an ID hash value of the obstacle, where the motion information includes location information. The running memory obtains a location and an ID of the obstacle located in the field of view of the navigation-type obstacle from the second cache of the obstacle resource pool based on the location information of the navigation-type obstacle. Alternatively, directly based on the location of the navigation-type obstacle carried in the obtaining request message and a location of each obstacle in the obstacle resource pool, the obstacle located in the field of view of the navigation-type obstacle is obtained. The field of view of the navigation-type obstacle is a circular area or a square area centered on the navigation-type obstacle, as shown in FIG. 9, and certainly may be another shape. A response message carrying the ID and motion information of the obstacle in the field of view of the navigation-type obstacle is sent to the CPU. The CPU obtains a target obstacle from the obstacles in the field of view of the navigation-type obstacle based on the motion mode of the navigation-type obstacle. For example, when the navigation-type obstacle travels forward, the target obstacle of the navigation-type obstacle includes an obstacle in the front or right front of the ego vehicle among the obstacles in the field of view of the navigation-type obstacle. For another example, when the navigation-type obstacle changes lane to the left, the target obstacle of the navigation-type obstacle includes an obstacle located on the left side or the left rear of the ego vehicle among the obstacles in the field of view of the navigation-type obstacle. Finally, motion mode of the target obstacle is predicted based on the motion information of the target obstacle, and moving of the navigation-type obstacle is controlled based on the motion mode of the target obstacle, to realize the interaction between the obstacles. For example, when the navigation-type obstacle travels forward, the front obstacle stops, and the navigation-type obstacle stops or changes lane to avoid rear-end collision. As shown in FIG. 9, there is a horizontal line in front of the navigation-type obstacle, indicating that the navigation-type obstacle stops.

It should be noted herein that, for detailed descriptions of the data channel between the obstacle and the resource pool, reference may be made to related descriptions in FIG. 6, which is not described herein again.

S807. Obtain a result of interaction between the ego vehicle and an obstacle of the ego vehicle when the ego vehicle changes lane to the right.

Figure 7:
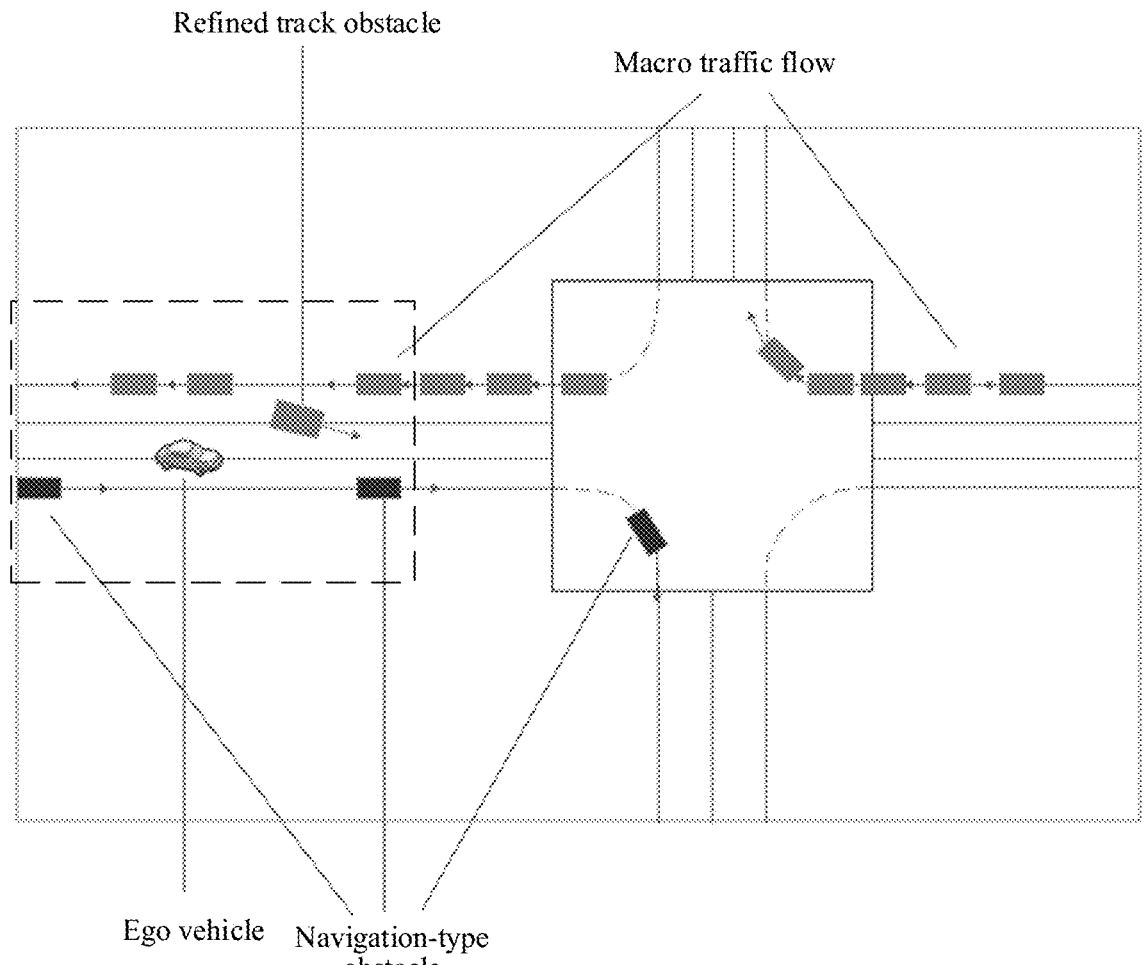
FIG. 7 is a schematic diagram of a test scenario.

In an embodiment, IDs and motion information of T second obstacles are obtained from the obstacle resource pool based on location information of the ego vehicle, where the T second obstacles are obstacles in the field of view of the ego vehicle, and T is an integer greater than 0. As shown in FIG. 7, an area in a dotted line box is a field of view of the ego vehicle, and obstacles in the field of view of the ego vehicle include a portion of the macro traffic flow, the refined track obstacle, and the navigation-type obstacle. An obstacle of the ego vehicle is determined from the T second obstacles based on a preset interaction manner (for example, changing lanes to the right) of the ego vehicle and location information of the T second obstacles, and motion information of the obstacle of the ego vehicle is obtained. The obstacle of the ego vehicle is a navigation-type obstacle located at the right rear of the ego vehicle. A result of interaction between the ego vehicle and the right-rear navigation-type obstacle is determined based on the motion information of the right-front navigation-type obstacle and the motion information of the ego vehicle. The interaction result includes successful lane changing and the ego vehicle is located in front of the right rear obstacle after changing lanes, successful lane changing and the ego vehicle is located behind the right rear obstacle after changing lanes, or collision between the ego vehicle and the right rear obstacle.

S808. Determine a test result of the autonomous-driving algorithm based on the interaction result.

For example, if the interaction result is that the lanes changing is successful and the ego vehicle is in front of the right rear obstacle after changing lanes, or the lanes changing is successful and the ego vehicle is behind the right rear obstacle after changing lanes, the autonomous-driving algorithm passes the test. If the interaction result is that the ego vehicle collides with the right rear obstacle, the autonomous-driving algorithm fails the test.

The obstacle resource pool is introduced, so that obstacles in a test scenario are centrally managed. To add, delete, and update obstacles in the test scenario, only the obstacle resource pool needs to be managed, and data transmission between a plurality of nodes and a plurality of data channels is not required. This simplifies the complexity of data communication on the simulation platform and improves simulation efficiency. Adding obstacles in the test scenario can realize detailed simulation of a specified scenario, which greatly improves the flexibility and intelligence of a simulation scenario. Based on the location of the obstacle, the obstacle in the field of view of the obstacle is determined in the second cache of the obstacle resource pool, where location information is used as an index in the obstacle resource pool. Searching the second cache for the obstacle in the field of view of the obstacle through the location information, the query efficiency is improved, and the interaction between obstacles is realized efficiently.

In an embodiment, in an HIL scenario in which a road test obstacle and another obstacle are formed, impact of the road test obstacle on a lane change policy of the ego vehicle to the right is tested, operations include the following operations.

S1001. Deploy a refined track obstacle in a test scenario.

S1002. Deploy a navigation-type obstacle in a test scenario.

S1003. Deploy a macro traffic flow in a test scenario.

It should be noted herein that, in an embodiment, the processes of operations S1001 to S1003, reference may be made to related descriptions of operations S801 to S803, which are not described herein again.

S1004. Configure a road test obstacle in a test scenario.

In an embodiment, configuration information of the road test obstacle is obtained, where the configuration information includes but is not limited to a subtype of the road test obstacle, an initial location and a speed of the road test obstacle in a real road test scenario, and the like. At this point, the test scenario shown in FIG. 10 has been built.

S1005. Build a data channel for performing data exchange between the obstacle resource pool and the obstacle.

It should be noted herein that, for the related description of the data channel, reference may be made to the description of FIG. 6, which is not described herein again.

Parallel processing of a plurality of report messages or a plurality of request messages ensures high efficiency and low latency of communication between the resource pool and the obstacle.

S1006. By using an ID of the obstacle as key information, use a hash algorithm to store information about the obstacle.

In an embodiment, initial motion information of the refined track obstacle, initial motion information of the navigation-type obstacle, initial motion information of the macro traffic flow, and initial motion information of road test obstacle are respectively parsed from the configuration information of the refined track obstacle, the configuration information of the navigation-type obstacle, the configuration information of the macro traffic flow, and the configuration information of the road test obstacle. Motion information about these obstacles is stored to the obstacle resource pool by using IDs of these obstacles as indexes.

In an embodiment, hash processing is performed on the ID of the refined track obstacle, the ID of the navigation-type obstacle, and the ID of the macro traffic flow, respectively, to obtain an ID hash value of the refined track obstacle, an ID hash value of the navigation-type obstacle, and an ID hash value of the macro traffic flow. The initial motion information of the obstacles is stored to a storage space indicated by the ID hash value of the obstacles in the first cache of the obstacle resource pool. By using the initial location information of these obstacles as an index, location information and the IDs of these obstacles are stored to the second cache of the obstacle resource pool. The obstacle resource pool is introduced, so that obstacles in a test scenario are centrally managed. In addition, the ID of the obstacle is stored in the obstacle resource pool by using the location information as an index, so that the ID of the obstacle in the field of view of the obstacle can be quickly searched out, and then motion information of the obstacle is obtained based on the ID, thereby improving search efficiency.

S1007. Obtain an obstacle and motion information of the obstacle in the field of view of the road test obstacle from the obstacle resource pool based on the ID of the road test obstacle. Then, a target obstacle and motion information of the target obstacle are determined from the obstacle in the field of view of the road test obstacle based on motion mode of the road test obstacle, and moving of the road test obstacle is controlled based on the motion information of the target obstacle.

Figure 10:
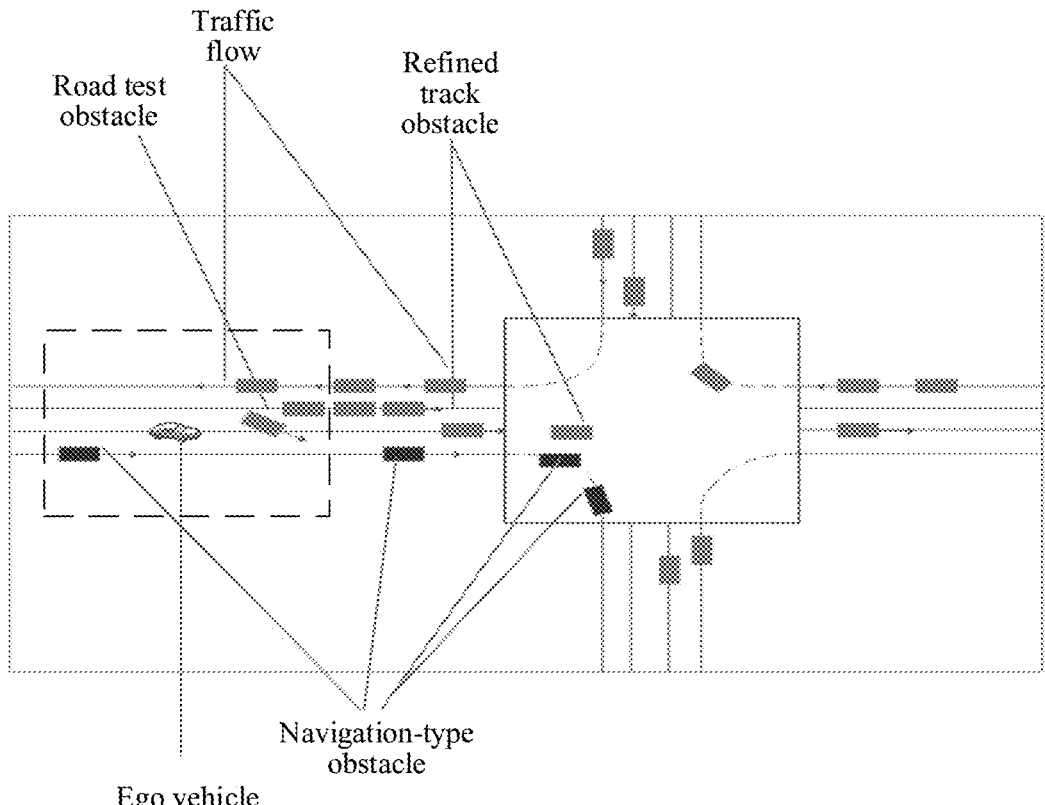
FIG. 10 is a schematic diagram of another test scenario.

As shown in FIG. 10, an obstacle in the field of view of the road test obstacle that is determined based on location of the road test obstacle includes the macro traffic flow and an ego vehicle that travels at the right rear of the road test obstacle. The road test obstacle follows the macro traffic flow in the same direction as the road test obstacle travels. Therefore, the target obstacle of the road test obstacle is the macro traffic flow in the same direction as the road test obstacle travels. When the macro traffic flow decelerates or stops, to avoid rear-end collision of road test obstacles, the road test obstacles are controlled to change lanes to the right. The road test obstacles interact with the macro traffic flow. The road test obstacles and the macro traffic flow form an enhanced HIL scenario.

S1008. Obtain a result of interaction between the ego vehicle and an obstacle of the ego vehicle when the ego vehicle changes lane to the right.

In an embodiment, IDs and motion information of T second obstacles are obtained from the obstacle resource pool based on location information of the ego vehicle, where the T second obstacles are obstacles in the field of view of the ego vehicle, and T is an integer greater than 0. As shown in FIG. 10, a field of view of the ego vehicle is shown by a dashed-line box in FIG. 10. The T second obstacles include obstacles located in the dashed-line box. Based on a preset interaction manner, for example, changing lanes to the right, and the location information of the T second obstacles, an obstacle of the ego vehicle is determined from the T second obstacles. The obstacle of the ego vehicle includes a navigation-type obstacle located at the right rear of the ego vehicle and a road test obstacle located at the right front of the ego vehicle and changing lanes to the lane where the ego vehicle is located. Motion information of the obstacle of the ego vehicle is obtained. A result of interaction between the ego vehicle and the ego vehicle is determined based on the motion information of the obstacle of the ego vehicle and the motion information of the ego vehicle. The interaction result includes the following situations. The ego vehicle stops changing lanes to the right and collides with road test obstacles. The ego vehicle stops changing lanes to the right and does not collide with road test obstacles. The ego vehicle collides with the navigation-type obstacle in the right rear when changing lanes to the right, or the ego vehicle does not collide with the right rear navigation-type obstacle when changing lanes to the right.

S1009. Determine a test result of the autonomous-driving algorithm based on the interaction result.

In an embodiment, when the ego vehicle collides with an obstacle at the right rear or a road test obstacle, it is determined that the autonomous-driving algorithm fails the test. If the ego vehicle does not collide with an obstacle at the right rear or a road test obstacle, it is determined that the autonomous-driving algorithm passes the test.

By introducing the road test obstacle and using the interaction between the road test obstacle and another obstacle, the enhanced HIL scenario is constructed. The data collected by the road test is effectively used, so that the obstacles in the real scenario collected by road test have dynamic interaction, which provides convenience for deploying complex scenarios.

Figure 11:
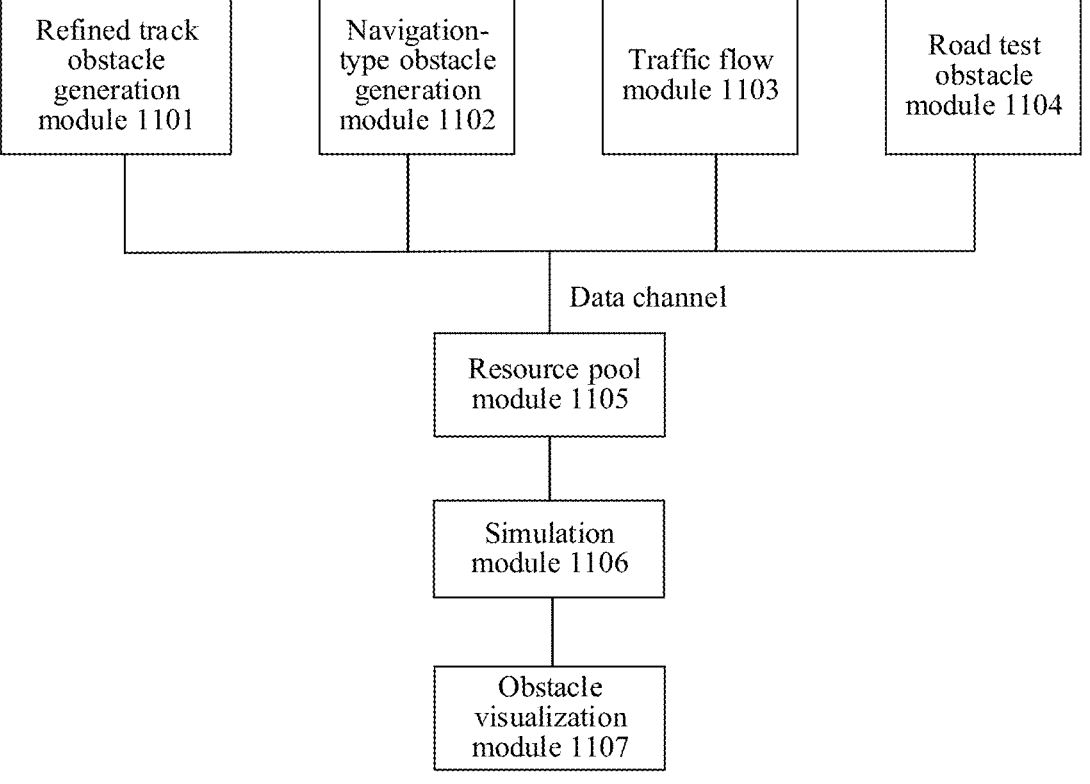
FIG. 11 is a schematic diagram of a structure of a simulation test apparatus according to an embodiment of this application.

Refer to FIG. 11. FIG. 11 is a schematic diagram of a structure of a simulation test apparatus according to an embodiment of this application. As shown in FIG. 11, the simulation test apparatus 1100 includes: a refined track obstacle generation module 1101, a navigation-type obstacle generation module 1102, a traffic flow module 1103, a road test obstacle module 1104, a resource pool module 1105, a simulation module 1106, and an obstacle visualization module 1107.

The refined track obstacle generation module 1101 is configured to generate a refined track obstacle based on an attribute of the refined track obstacle, and then use a vehicle dynamics model and a Dubin's curve to generate a refined track obstacle based on the attribute of the refined track obstacle. The attribute of the refined track obstacle includes but is not limited to a type, a speed, coordinates of a start point, coordinates of a track point, coordinates of an end point, and the like of the obstacle.

The navigation-type obstacle generation module 1102 is configured to generate a navigation-type obstacle based on an attribute of the navigation-type obstacle, where the attribute of the navigation-type obstacle includes but is not limited to a type, a speed, coordinates of a start point, and coordinates of an end point of the obstacle. (The track of the obstacle is based on the coordinates of the start point and the coordinates of the end point through a high-precision map).

The traffic flow module 1103 is configured to deploy a macro traffic flow in a test scenario, where an attribute of the traffic flow includes but is not limited to a quantity of obstacles, a type, coordinates of a start point, coordinates of an end point, and the like of the obstacle in the traffic flow. The traffic flow module is configured to generate a traffic flow based on an attribute of the traffic flow. In an embodiment, a traffic flow is generated through the third-party traffic flow software based on attribute of the traffic flow. Alternatively, the attribute of the traffic flow is sent to a third-party device, and the third-party device generates the traffic flow based on the attribute of the traffic flow through the third-party traffic flow software, and the traffic flow is sent to the traffic flow module 1103.

The road test obstacle module 1104 is configured to deploy a road test obstacle in the test scenario, where an attribute of the road test obstacle includes but is not limited to a subtype, coordinates, a speed, and a heading angle of the road test obstacle. It should be noted that, when the road test obstacle interacts with another obstacle (for example, the refined track obstacle, the navigation-type obstacle, or the macro traffic flow), the road test obstacle and another obstacle form an enhanced HIL scenario.

The resource pool module 1105 is configured to store motion information of each obstacle based on an ID of each obstacle. In an embodiment, the obstacle resource pool includes a first cache and a second cache. Hash processing is performed on the ID of the obstacle to obtain an ID hash value of the obstacle. Motion information of the obstacle is stored in a storage space indicated by the ID hash value in the first cache by using the ID hash value as a storage address. The ID and the location information of the obstacle are stored in the second cache by using the location information of the obstacle as an index.

The simulation module 1106 is configured to: for each obstacle in the test scenario in a process of testing the autonomous-driving algorithm, obtain motion information of an obstacle that potentially interacts with the obstacle in real time, and control moving of the obstacle based on the motion information. In this way, the interaction between obstacles is achieved. For an ego vehicle moving based on the autonomous-driving algorithm, motion information of an obstacle that potentially interacts with the ego vehicle is obtained, an interaction result is obtained based on the motion information of the ego vehicle and moving of the obstacles, and whether the autonomous-driving algorithm passes the test is determined based on the interaction result.

It should be noted herein that, for a function implementation process of the simulation module 1106, reference may be made to related descriptions of operations S203 to S205, S805 to S807, and S1006 to S1009, which are not described herein again.

The obstacle visualization module 1107 is configured to display a position relationship between the obstacles and the ego vehicle in real time on a display interface.

Figure 12:
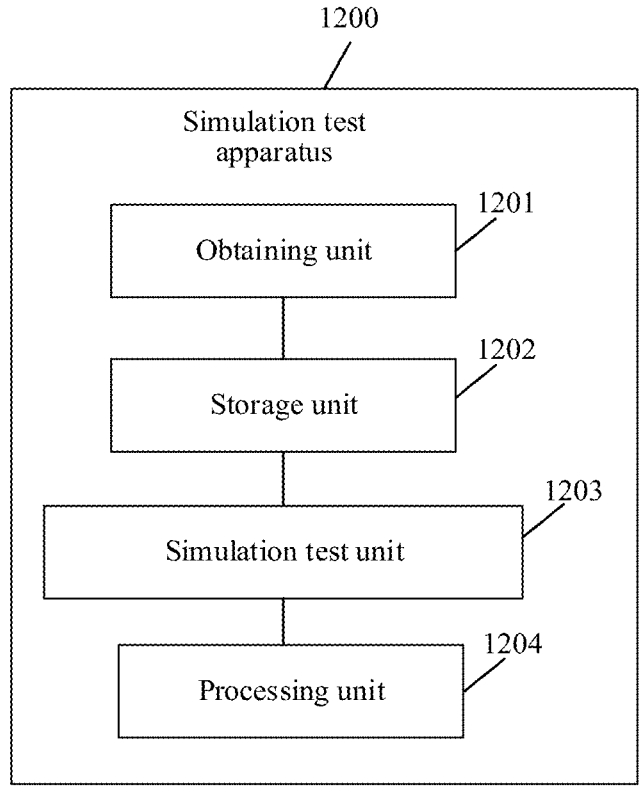
FIG. 12 is a schematic diagram of a structure of another simulation test apparatus according to an embodiment of this application.

Refer to FIG. 12. FIG. 12 is a schematic diagram of a structure of a simulation test apparatus according to an embodiment of this application. As shown in FIG. 12, the simulation test apparatus 1200 includes an obtaining unit 1201, a storage unit 1202, and a simulation test unit 1203.

The obtaining unit 1201 is configured to obtain N obstacles from an obstacle set based on a test function of an autonomous-driving algorithm. The N obstacles include an obstacle of an ego vehicle and a surrounding obstacle of the obstacle of the ego vehicle, and there are a part or all of the following types of obstacles in the N obstacles: a refined track obstacle, a navigation-type obstacle, a macro traffic flow, and/or a road test obstacle. N is an integer greater than 0.

The storage unit 1202 is configured to store an ID and initial motion information of each of the N obstacles to an obstacle resource pool.

The simulation test unit 1203 is configured to: obtain motion information of a surrounding obstacle of a first obstacle from the obstacle resource pool based on an ID of the first obstacle, and control moving of the first obstacle based on the motion information of the surrounding obstacle of the first obstacle, to obtain first motion information of each obstacle; update initial motion information of the first obstacle in the obstacle resource pool to the first motion information of the first obstacle; obtain first motion information of n obstacles from the obstacle resource pool based on location information of the ego vehicle, where the n obstacles are obstacles of the ego vehicle, and n is less than or equal to N; obtain a result of interaction between the ego vehicle and the n obstacles based on the first motion information of the n obstacles, and determine a test result of the autonomous-driving algorithm based on the interaction result.

In an embodiment, the obstacle resource pool includes a first cache and a second cache, the initial motion information includes initial location information, and the simulation test apparatus 1200 further includes a processing unit 1204.

The processing unit 1204 is configured to perform hash processing on the ID of each of the N obstacles, to obtain an ID hash value of each obstacle, where the ID hash value of each obstacle indicates a storage space of motion information of the obstacle in a first cache.

The storage unit 1202 is configured to:
store the initial motion information of each of the N obstacles to a storage space indicated by the ID hash value of the obstacle in the first cache; and store, by using initial location information of each of the N obstacles as an index, the ID and the initial location information of each obstacle to the second cache.

In an embodiment, the obstacle resource pool includes the first cache and the second cache. In terms of the obtaining motion information of a surrounding obstacle of the first obstacle from the obstacle resource pool based on an ID of the first obstacle, the simulation test unit 1203 is configured to:
obtain the initial motion information of the first obstacle from the first cache based on an ID hash value of the first obstacle, where the initial motion information includes initial location information, and the ID hash value of the first obstacle is obtained by performing hash processing on the ID of the first obstacle; obtain IDs of S obstacles from the second cache based on the initial location information of the first obstacle, where the S obstacles are obstacles located in a preset area of the first obstacle, the preset area of the first obstacle is determined based on the initial location information of the first obstacle, and S is less than or equal to N; determine the surrounding obstacle of the first obstacle from the S obstacles based on a motion mode of the first obstacle, where the surrounding obstacle of the first obstacle is an obstacle that is among the S obstacles and that potentially interacts with the first obstacle when the first obstacle moves in the motion mode; and obtain the initial motion information of the surrounding obstacle from the first cache based on an ID hash value of the surrounding obstacle of the first obstacle, where the ID hash value of the surrounding obstacle of the first obstacle is obtained by performing hash processing on the ID of the surrounding obstacle of the first obstacle.

In an embodiment, the first motion information includes first location information. In terms of the updating initial motion information of the first obstacle in the obstacle resource pool to the first motion information, the simulation test unit 1203 is configured to:
determine, from the second cache based on the initial location information of the first obstacle, an ID corresponding to the initial location information of the first obstacle, and update the initial location information of the first obstacle in the second cache to the first location information of the first obstacle if the ID corresponding to the initial location information of the first obstacle is the ID of the first obstacle; and update the initial motion information of the first obstacle in the first cache to the first motion information based on the ID hash value of the first obstacle.

In an embodiment, the first motion information includes the first location information. In terms of obtaining first motion information of n obstacles from the obstacle resource pool based on location information of the ego vehicle, the simulation test unit 1203 is configured to:
determine IDs and first location information of M obstacles from the second cache based on the location information of the ego vehicle, where the M obstacles are obstacles located within a preset range of the ego vehicle, the preset range of the ego vehicle is determined based on the location information of the ego vehicle, and M is a positive integer less than or equal to N; determine the n obstacles from the M obstacles based on a preset interaction manner and the first location information of the M obstacles, where the n obstacles are the obstacles that potentially interact with the ego vehicle; and determine first motion information of each of the n obstacles from the first cache based on an ID hash value of each of then obstacles.

It should be noted that, the above units (the obtaining unit 1201, the storage unit 1202, simulation test unit 1203, and the processing unit 1204) are configured to execute related content of operations S201 to S205 of the foregoing method. The obtaining unit 1201 is configured to execute related content of operation S201, the storage unit 1202 is configured to execute related content of operation S202, and the simulation test unit is configured to execute related content of operations S203 to S205.

In an embodiment, the simulation test apparatus 1200 is presented as a unit. The "unit" herein may be an application-specific integrated circuit (ASIC), a processor and a memory that execute one or more software or firmware programs, an integrated logic circuit, and/or another device that can provide the foregoing functions. In addition, the obtaining unit 1201, the storage unit 1202, the simulation test unit 1203, and the processing unit 1204 may be implemented by the processor 1301 of the simulation test apparatus shown in FIG. 13.

Figure 13:
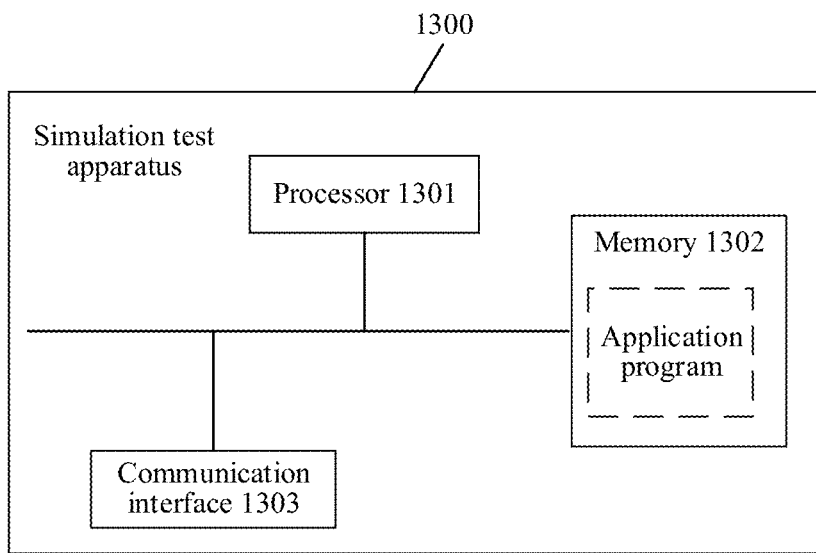
FIG. 13 is a schematic diagram of a structure of another simulation test apparatus according to an embodiment of this application.

As shown in FIG. 13, the simulation test apparatus 1300 may be implemented by the structure in FIG. 13. The simulation test apparatus 1300 includes at least one processor 1301, at least one memory 1302, and at least one communication interface 1303. The processor 1301, the memory 1302, and the communication interface 1303 are connected and communicate with each other via the communication bus.

The processor 1301 may be a general-purpose central processing unit (CPU), a microprocessor, an application-specific integrated circuit (ASIC), or one or more integrated circuits for controlling program execution for the foregoing solutions.

The communication interface 1303 is configured to communicate with another device or a communication network such as the Ethernet, a radio access network (RAN), or a wireless local area network (WLAN).

The memory 1302 may be but is not limited to a read-only memory (ROM) or another type of static storage device capable of storing static information and instructions, a random access memory (RAM) or another type of dynamic storage device capable of storing information and instructions, an electrically erasable programmable read-only memory (EEPROM), a compact disc read-only memory (CD-ROM) or another compact disc storage, an optical disc storage (including a compact disc, a laser disc, an optical disc, a digital versatile disc, a Blu-ray disc, and the like), a magnetic disk storage medium or another magnetic storage device, or any other medium that can be used to carry or store expected program code in a form of instructions or a data structure and can be accessed by a computer. The memory may exist independently, and is connected to the processor via a bus. Alternatively, the memory and the processor may be integrated.

The memory 1302 is configured to store application program code for executing the foregoing solution, and the processor 1301 controls execution of the application program code. The processor 1301 is configured to execute the application program code stored in the memory 1302.

The code stored in the memory 1302 may execute any method for testing the autonomous-driving algorithm provided above, and examples are as follows. N obstacles are obtained from an obstacle set based on a test function of the autonomous-driving algorithm, where the N obstacles include an obstacle of an ego vehicle and a surrounding obstacle of the obstacle of the ego vehicle, and N is an integer greater than 0. An ID and initial motion information of each of the N obstacles is stored to an obstacle resource pool. Motion information of a surrounding obstacle of a first obstacle is obtained from the obstacle resource pool based on an ID of the first obstacle, and moving of the first obstacle is controlled based on the motion information of the surrounding obstacle of the first obstacle, to obtain motion information of the first obstacle. Motion information of each obstacle is stored to the obstacle resource pool. First motion information of n obstacles is obtained from the obstacle resource pool based on location information of the ego vehicle, where the n obstacles are obstacles of the ego vehicle, and n is less than or equal to N. A result of interaction between the ego vehicle and the n obstacles is obtained based on the first motion information of the n obstacles. A test result of the autonomous-driving algorithm is determined based on the interaction result.

An embodiment of the application further provides a computer storage medium. The computer storage medium may store a program. When the program is executed, a part or all of the operations in any method for testing the autonomous-driving algorithm recorded in the foregoing method embodiments are included.

It should be noted that, to make the description brief, the foregoing method embodiments are expressed as a series of actions. However, persons skilled in the art should appreciate that this application is not limited by a sequence of actions described, because according to an embodiment of the application, some operations may be performed in other sequences or performed simultaneously. In addition, persons skilled in the art should also aware that the described embodiments all belong to preferable embodiments, and the involved actions and modules are not necessarily required by this application.

In the foregoing embodiments, the description of each embodiment has respective focuses. For a part that is not described in detail in an embodiment, reference may be made to related descriptions in other embodiments.

In the several embodiments provided in this application, it should be understood that the disclosed apparatus may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic or other forms.

The units described as separate parts may or may not be physically separate, and parts displayed as units may or may not be physical units, may be located at one position, or may be distributed on a plurality of network units. A part or all of the units may be selected based on actual requirements to achieve the objectives of the solutions of embodiments.

In addition, functional units in embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage. Based on such an understanding, the technical solutions of this application essentially, or the part contributing to the conventional technology, or all or some of the technical solutions may be implemented in a form of a software product. The computer software product is stored in a memory and includes several instructions for instructing a computer device (which may be a personal computer, a server, a network device, or the like) to perform all or some of the operations of the methods described in embodiments of the application. The foregoing memory includes: any medium that can store program code, such as a USB flash drive, a read-only memory (ROM), a random access memory (RAM), a removable hard disk, a magnetic disk, or an optical disc.

Persons of ordinary skill in the art may understand that all or some of the operations of the methods in the foregoing embodiments may be implemented by a program instructing relevant hardware. The program may be stored in a computer-readable memory, and the memory may include: a flash drive, a read-only memory (ROM for short), a random access device (RAM for short), a magnetic disk or an optical disk, and the like.

The foregoing describes embodiments of this application in detail. The principles and implementations of this application are described by using examples in this specification. The description of the foregoing embodiments is merely used to help understand the method and the core idea of this application. In addition, persons of ordinary skill in the art may make modifications to the implementations and the application scope based on the idea of this application. In conclusion, the content of this specification shall not be construed as a limitation on this application.

What is claimed is:

1. A method for testing an autonomous-driving algorithm, comprising:

obtaining N obstacles from an obstacle set based on a test function of the autonomous-driving algorithm, wherein the N obstacles comprise an obstacle of an ego vehicle and a surrounding obstacle of the obstacle of the ego vehicle, including one or more of: a refined track obstacle, a navigation-type obstacle, a macro traffic flow, or a real road test obstacle; and N is an integer greater than 0;

storing an ID and initial motion information of each of the N obstacles to an obstacle resource pool, wherein the obstacle resource pool comprises a first cache and a second cache, and storing the ID and the initial motion information of each of the N obstacles includes:

storing the initial motion information of each of the N obstacles to a storage space indicated by an ID hash value of the obstacle in the first cache, wherein the initial motion information is obtained from configuration information of the respective obstacle; and storing, by using initial location information of each of the N obstacles as an index, the ID and the initial location information of the obstacle to the second cache;

obtaining initial motion information of a surrounding obstacle of a first obstacle from the obstacle resource pool based on the ID of the first obstacle, and controlling moving of the first obstacle based on the initial motion information of the surrounding obstacle of the first obstacle, to obtain first motion information of the first obstacle, wherein the first motion information includes a speed, a heading angle, and a location of the first obstacle;

updating initial motion information of the first obstacle in the obstacle resource pool to the first motion information, wherein the first obstacle is any one of the N obstacles;

obtaining first motion information of n obstacles from the obstacle resource pool based on location information of the ego vehicle, wherein the n obstacles are obstacles of the ego vehicle, and n is less than or equal to N;

obtaining a result of interaction between the ego vehicle and the n obstacles based on the first motion information of the n obstacles; and determining a test result of the autonomous-driving algorithm based on the interaction result.

2. The method according to claim 1, wherein the initial motion information comprises the initial location information, and wherein the method further comprises:

performing hash processing on the ID of each of the N obstacles, to obtain the ID hash value of each obstacle.

3. The method according to claim 1, wherein the obtaining initial motion information of the surrounding obstacle of the first obstacle from the obstacle resource pool based on the ID of the first obstacle comprises:

obtaining the initial motion information of the first obstacle from the first cache based on the ID hash value of the first obstacle, wherein the initial motion information comprises the initial location information, and wherein the ID hash value of the first obstacle is obtained by performing hash processing on the ID of the first obstacle;

obtaining IDs of S obstacles from the second cache based on the initial location information of the first obstacle, wherein the S obstacles are located in a preset area of the first obstacle, wherein the preset area of the first obstacle is determined based on the initial location information of the first obstacle, and wherein S is less than or equal to N;

determining the surrounding obstacle of the first obstacle from the S obstacles based on a motion mode of the first obstacle, wherein the surrounding obstacle of the first obstacle is among the S obstacles and that potentially interacts with the first obstacle when the first obstacle moves in the motion mode; and obtaining the initial motion information of the surrounding obstacle from the first cache based on an ID hash value of the surrounding obstacle of the first obstacle, wherein the ID hash value of the surrounding obstacle of the first obstacle is obtained by performing hash processing on the ID of the surrounding obstacle.

4. The method according to claim 3, wherein the first motion information comprises first location information, and wherein the updating initial motion information of the first obstacle in the obstacle resource pool to the first motion information comprises:

determining, from the second cache based on the initial location information of the first obstacle, an ID corresponding to the initial location information of the first obstacle, and updating the initial location information of the first obstacle in the second cache to the first location information of the first obstacle if the ID corresponding to the initial location information of the first obstacle is the ID of the first obstacle, and updating the initial motion information of the first obstacle in the first cache to the first motion information based on the ID hash value of the first obstacle.

5. The method according to claim 2, wherein the first motion information comprises first location information, and wherein the obtaining first motion information of n obstacles from the obstacle resource pool based on the location information of the ego vehicle comprises:

determining IDs and first location information of M obstacles from the second cache based on the location information of the ego vehicle, wherein the M obstacles are located within a preset range of the ego vehicle, wherein the preset range of the ego vehicle is determined based on the location information of the ego vehicle, and wherein M is a positive integer less than or equal to N;

determining the n obstacles from the M obstacles based on a preset interaction manner and the first location information of the M obstacles, wherein the n obstacles potentially interact with the ego vehicle; and determining the first motion information of each of the n obstacles from the first cache based on an ID hash value of each of the n obstacles.

6. A simulation test apparatus, comprising:

an obtaining unit, configured to obtain N obstacles from an obstacle set based on a test function of an autonomous-driving algorithm, wherein the N obstacles comprise an obstacle of an ego vehicle and a surrounding obstacle of the obstacle of the ego vehicle, including one or more of: a refined track obstacle, a navigation-type obstacle, a macro traffic flow, or a real road test obstacle; and N is an integer greater than 0;

a storage unit, configured to store an ID and initial motion information of each of the N obstacles to an obstacle resource pool, wherein the obstacle resource pool comprises a first cache and a second cache, and storing the ID and the initial motion information of each of the N obstacles includes:

store the initial motion information of each of the N obstacles to a storage space indicated by an ID hash value of the obstacle in the first cache, wherein the initial motion information is obtained from configuration information of the respective obstacle for a test scenario; and store, by using initial location information of each of the N obstacles as an index, the ID and the initial location information of the obstacle to the second cache; and a simulation test unit, configured to: obtain motion information of a surrounding obstacle of a first obstacle from the obstacle resource pool based on the ID of the first obstacle, and control moving of the first obstacle based on the motion information of the surrounding obstacle of the first obstacle, to obtain first motion information of the first obstacle, wherein the first motion information includes a speed, a heading angle, and a location of the first obstacle; update initial motion information of the first obstacle in the obstacle resource pool to the first motion information; obtain first motion information of n obstacles from the obstacle resource pool based on location information of the ego vehicle, wherein the n obstacles are obstacles of the ego vehicle, and n is less than or equal to N; obtain a result of interaction between the ego vehicle and the n obstacles based on the first motion information of the n obstacles; and determine a test result of the autonomous-driving algorithm based on the interaction result.

7. The apparatus according to claim 6, wherein the initial motion information comprises the initial location information, and wherein the apparatus further comprises:

a processing unit, configured to perform hash processing on the ID of each of the N obstacles, to obtain the ID hash value of each obstacle.

8. The apparatus according to claim 6, and wherein the obtain motion information of the surrounding obstacle of the first obstacle from the obstacle resource pool based on the ID of the first obstacle, the simulation test unit is configured to:

obtain the initial motion information of the first obstacle from the first cache based on the ID hash value of the first obstacle, wherein the initial motion information comprises the initial location information, and wherein the ID hash value of the first obstacle is obtained by performing hash processing on the ID of the first obstacle;

obtain IDs of S obstacles from the second cache based on the initial location information of the first obstacle, wherein the S obstacles are located in a preset area of the first obstacle, wherein the preset area of the first obstacle is determined based on the initial location information of the first obstacle, and wherein S is less than or equal to N;

determine the surrounding obstacle of the first obstacle from the S obstacles based on a motion mode of the first obstacle, wherein the surrounding obstacle of the first obstacle is among the S obstacles and that potentially interacts with the first obstacle when the first obstacle moves in the motion mode; and obtain the initial motion information of the surrounding obstacle from the first cache based on an ID hash value of the surrounding obstacle of the first obstacle, wherein the ID hash value of the surrounding obstacle of the first obstacle is obtained by performing hash processing on the ID of the surrounding obstacle.

9. The apparatus according to claim 8, wherein the first motion information comprises first location information, and wherein the update initial motion information of the first obstacle in the obstacle resource pool to the first motion information, the simulation test unit is configured to:

determine, from the second cache based on the initial location information of the first obstacle, an ID corresponding to the initial location information of the first obstacle, and update the initial location information of the first obstacle in the second cache to the first location information of the first obstacle if the ID corresponding to the initial location information of the first obstacle is the ID of the first obstacle; and update the initial motion information of the first obstacle in the first cache to the first motion information based on the ID hash value of the first obstacle.

10. The apparatus according to claim 7, wherein the first motion information comprises first location information, and wherein the obtain first motion information of n obstacles from the obstacle resource pool based on the location information of the ego vehicle, the simulation test unit is configured to:

determine IDs and first location information of M obstacles from the second cache based on the location information of the ego vehicle, wherein the M obstacles are located within a preset range of the ego vehicle, the preset range of the ego vehicle is determined based on the location information of the ego vehicle, and M is a positive integer less than or equal to N;

determine the n obstacles from the M obstacles based on a preset interaction manner and the first location information of the M obstacles, wherein the n obstacles potentially interact with the ego vehicle; and determine the first motion information of each of the n obstacles from the first cache based on the ID hash value of each of the n obstacles.

11. A simulation test apparatus, comprising:

a processor, and a memory coupled with the processor to store instructions; which when executed by the processor, cause the processor to perform operations, the operations comprising:

obtaining N obstacles from an obstacle set based on a test function of an autonomous-driving algorithm, wherein the N obstacles comprise an obstacle of an ego vehicle and a surrounding obstacle of the obstacle of the ego vehicle, including one or more of: a refined track obstacle, a navigation-type obstacle, a macro traffic flow, or a real road test obstacle; and N is an integer greater than 0;

storing an ID and initial motion information of each of the N obstacles to an obstacle resource pool, wherein the obstacle resource pool comprises a first cache and a second cache, and storing the ID and the initial motion information of each of the N obstacles includes:

storing the initial motion information of each of the N obstacles to a storage space indicated by an ID hash value of the obstacle in the first cache, wherein the initial motion information is obtained from configuration information of the respective obstacle for a test scenario; and storing, by using initial location information of each of the N obstacles as an index, an ID and the initial location information of the obstacle to the second cache;

obtaining initial motion information of a surrounding obstacle of a first obstacle from the obstacle resource pool based on an ID of the first obstacle, and controlling moving of the first obstacle based on the initial motion information of the surrounding obstacle of the first obstacle, to obtain first motion information of the first obstacle, wherein the first motion information includes a speed, a heading angle, and a location of the first obstacle;

updating initial motion information of the first obstacle in the obstacle resource pool to the first motion information, wherein the first obstacle is any one of the N obstacles;

obtaining first motion information of n obstacles from the obstacle resource pool based on location information of the ego vehicle, wherein the n obstacles are obstacles of the ego vehicle, and n is less than or equal to N;

obtaining a result of interaction between the ego vehicle and the n obstacles based on the first motion information of the n obstacles; and determining a test result of the autonomous-driving algorithm based on the interaction result.

12. A chip system, wherein the chip system is used in an electronic device; the chip system comprises one or more interface circuits and one or more processors; the interface circuit and the processor are interconnected through a line; the interface circuit is configured to receive a signal from a memory of the electronic device, and send the signal to the processor, wherein the signal comprises computer instructions stored in the memory; and when the processor executes the computer instructions, the electronic device performs the method according to claim 1.

13. A non-transitory machine-readable storage medium having instructions stored therein, which when executed by a processor, cause the processor to perform operations, the operations comprising:

obtaining N obstacles from an obstacle set based on a test function of an autonomous-driving algorithm, wherein the N obstacles comprise an obstacle of an ego vehicle and a surrounding obstacle of the obstacle of the ego vehicle, including one or more of: a refined track obstacle, a navigation-type obstacle, a macro traffic flow, or a real road test obstacle; and N is an integer greater than 0;

storing an ID and initial motion information of each of the N obstacles to an obstacle resource pool, wherein the obstacle resource pool comprises a first cache and a second cache, and storing the ID and the initial motion information of each of the N obstacles includes:

storing the initial motion information of each of the N obstacles to a storage space indicated by an ID hash value of the obstacle in the first cache, wherein the initial motion information is obtained from configuration information of the respective obstacle for a test scenario; and storing, by using initial location information of each of the N obstacles as an index, the ID and the initial location information of the obstacle to the second cache;

obtaining initial motion information of a surrounding obstacle of a first obstacle from the obstacle resource pool based on an ID of the first obstacle, and controlling moving of the first obstacle based on the initial motion information of the surrounding obstacle of the first obstacle, to obtain first motion information of the first obstacle, wherein the first motion information includes a speed, a heading angle, and a location of the first obstacle;

updating initial motion information of the first obstacle in the obstacle resource pool to the first motion information, wherein the first obstacle is any one of the N obstacles;

obtaining first motion information of n obstacles from the obstacle resource pool based on location information of the ego vehicle, wherein the n obstacles are obstacles of the ego vehicle, and n is less than or equal to N;

obtaining a result of interaction between the ego vehicle and the n obstacles based on the first motion information of the n obstacles; and determining a test result of the autonomous-driving algorithm based on the interaction result.

14. A computer program product, comprising computer instructions, and when the computer instructions are run on an electronic device, the electronic device is enabled to perform the method according to claim 1.

15. The non-transitory machine-readable storage medium according to claim 13, wherein the initial motion information comprises the initial location information, and wherein the operations further comprises:

performing hash processing on the ID of each of the N obstacles, to obtain the ID hash value of each obstacle.

16. The non-transitory machine-readable storage medium according to claim 13, wherein the obtaining initial motion information of the surrounding obstacle of the first obstacle from the obstacle resource pool based on the ID of the first obstacle comprises:

obtaining the initial motion information of the first obstacle from the first cache based on an ID hash value of the first obstacle, wherein the initial motion information comprises the initial location information, and wherein the ID hash value of the first obstacle is obtained by performing hash processing on the ID of the first obstacle;

obtaining IDs of S obstacles from the second cache based on the initial location information of the first obstacle, wherein the S obstacles are located in a preset area of the first obstacle, wherein the preset area of the first obstacle is determined based on the initial location information of the first obstacle, and wherein S is less than or equal to N;

determining the surrounding obstacle of the first obstacle from the S obstacles based on a motion mode of the first obstacle, wherein the surrounding obstacle of the first obstacle is among the S obstacles and that potentially interacts with the first obstacle when the first obstacle moves in the motion mode; and obtaining the initial motion information of the surrounding obstacle from the first cache based on the ID hash value of the surrounding obstacle of the first obstacle, wherein the ID hash value of the surrounding obstacle of the first obstacle is obtained by performing hash processing on the ID of the surrounding obstacle.

17. The non-transitory machine-readable storage medium according to claim 16, wherein the first motion information comprises first location information, and wherein the updating initial motion information of the first obstacle in the obstacle resource pool to the first motion information comprises:

determining, from the second cache based on the initial location information of the first obstacle, an ID corresponding to the initial location information of the first obstacle, and updating the initial location information of the first obstacle in the second cache to the first location information of the first obstacle if the ID corresponding to the initial location information of the first obstacle is the ID of the first obstacle, and updating the initial motion information of the first obstacle in the first cache to the first motion information based on the ID hash value of the first obstacle.

18. The non-transitory machine-readable storage medium according to claim 15, wherein the first motion information comprises first location information, and wherein the obtaining first motion information of n obstacles from the obstacle resource pool based on the location information of the ego vehicle comprises:

determining IDs and first location information of M obstacles from the second cache based on the location information of the ego vehicle, wherein the M obstacles are located within a preset range of the ego vehicle, wherein the preset range of the ego vehicle is determined based on the location information of the ego vehicle, and wherein M is a positive integer less than or equal to N;

determining the n obstacles from the M obstacles based on a preset interaction manner and the first location information of the M obstacles, wherein the n obstacles potentially interact with the ego vehicle; and determining the first motion information of each of the n obstacles from the first cache based on the ID hash value of each of the n obstacles.

\* \* \* \* \*